US006623910B2

(12) United States Patent
Shimada et al.

(10) Patent No.: US 6,623,910 B2
(45) Date of Patent: Sep. 23, 2003

(54) PLANOGRAPHIC PRINTING PLATE PRECURSOR

(75) Inventors: Kazuto Shimada, Shizuoka-ken (JP); Tadahiro Sorori, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 10/093,746

(22) Filed: Mar. 11, 2002

(65) Prior Publication Data

US 2003/0017411 A1 Jan. 23, 2003

(30) Foreign Application Priority Data

Mar. 12, 2001 (JP) ...................................... 2001-069168

(51) Int. Cl.$^7$ ................................................ G03F 7/038

(52) U.S. Cl. ................................ 430/270.1; 430/281.1; 430/288.1; 430/944; 430/964; 101/453; 101/467

(58) Field of Search ................................ 430/157, 163, 430/170, 171, 270.1, 281.1, 286.1, 287.1, 288.1, 302, 348, 944, 945, 964; 101/453, 463.1, 465, 466, 467

(56) References Cited

U.S. PATENT DOCUMENTS 4,708,925 A * 11/1987 Newman ................. 430/270.1
5,250,385 A * 10/1993 Kondo et al. ............... 430/192
5,807,659 A * 9/1998 Nishimiya et al. .......... 430/302
6,232,038 B1 * 5/2001 Takasaki et al. ......... 430/281.1
6,238,838 B1 * 5/2001 Gaschler et al. ......... 430/278.1
6,423,469 B1 * 7/2002 DoMinh et al. ......... 430/270.1
2001/0036598 A1 * 11/2001 Shimada et al. ......... 430/281.1
2002/0142249 A1 * 10/2002 Ohshima ................. 430/283.1
2002/0160295 A1 * 10/2002 Aoshima et al. ............ 430/176
2002/0177074 A1 * 11/2002 Hoshi et al. ............. 430/281.1

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A negative planographic printing plate precursor for heat-mode exposure systems, which has, on a support, a photosensitive layer containing: (A) a light-to-heat conversion agent; (B) a polymerizable unsaturated group-having compound; and (C) an onium salt having a counter anion with a valency of at least 2. The precursor is capable of being exposed with an IR laser for image formation thereon. The onium salt may be, for example, a diazonium salt, iodonium salt or sulfonium salt. The counter anion has at least two anionic sites which may be the same or different, and the anionic structure is preferably divalent to hexavalent.

17 Claims, No Drawings

PLANOGRAPHIC PRINTING PLATE PRECURSOR

BACKGROUND OF THE PRESENT INVENTION

1. Field of the Present Invention

The present invention relates to a planographic printing plate precursor capable of being exposed by an IR laser for image formation thereon. More specifically, the present invention relates to such planographic printing plate precursor having a negative recording layer of high recording sensitivity.

2. Description of the Related Art

The recent development of laser technology has been remarkable, and high-power, small-sized solid lasers and semiconductor lasers for emitting near-IR and IR rays have become readily available. For light sources for directly processing printing plate precursors from digital data of computers or the like, these lasers are extremely useful.

Negative planographic printing plate materials for IR lasers, that is, materials to be processed for image formation thereon, with an IR laser capable of emitting IR rays as a light source, generally have a photosensitive layer that comprises an IR absorbent, a polymerization initiator capable of generating a radical when exposed to light or heat, and a polymerizable compound.

One example of such negative image recording materials is described in U.S. Pat. No. 5,340,699, which features an IR absorbent, an acid generator, a resol resin and a novolak resin. However, negative image recording materials of this type require heat treatment at 140 to 200° C. for 50 to 120 seconds or so, after exposure to a laser for image formation thereon, and this heat treatment often requires a large, complicated device and much energy.

Japanese Patent Application Publication (JP-B) No. 7-103171 discloses a recording material that includes a cyanine dye having a specific structure, an iodonium salt, and an ethylenically unsaturated double bond-having addition-polymerizable compound. This does not require heat treatment after imagewise exposure to light. However, the recording material disclosed is problematic in that the polymerization of the polymerizable compound therein is often retarded by oxygen in air, and therefore sensitivity is not satisfactory. Japanese Patent Application Laid-Open (JP-A) No. 8-108621 discloses an image-recording medium that features an ordinary thermal polymerization initiator, which is an organic peroxide or azobisisobutyronitrile compound, and a thermo-polymerizable resin. Regarding image-recording sensitivity, however, this medium requires an energy level of at least 200 $mJ/cm^2$. Accordingly, to increase sensitivity, the medium must be pre-heated before exposure to light. At present, no one has succeeded in realizing high-sensitivity recording materials satisfactory for practical use.

SUMMARY OF THE PRESENT INVENTION

An object of the present invention is to provide a negative planographic printing plate precursor of high sensitivity, which can be imagewise exposed by IR rays from an IR-emitting solid laser or semiconductor laser for direct image formation thereon from digital data of a computer or the like, without requiring a heat treatment after this exposure to light for image formation.

Having specifically noted the constituent components of negative image-recording materials and having assiduously studied them, the present inventors have found that, when an onium salt whose counter anion has a divalent anionic structure is used for a polymerization initiator, the recording sensitivity of an image-recording material can be increased. On the basis of this finding, we have completed the present invention.

Specifically, the present invention provides a negative planographic printing plate precursor for a heat-mode exposure system, the plate precursor having, on a support, a photosensitive layer that is exposable with an IR laser, the photosensitive layer including: (A) a light-to-heat conversion agent; (B) a polymerizable unsaturated group-having compound; and (C) a polyvalent anionic onium salt having a counter anion that has a valency of at least two.

Although not clear, the mechanism of the planographic printing plate precursor of the present invention is thought to be as follows: In the plate precursor, the counter anion of the onium salt that serves as an initiator, such as a sulfonium, iodonium, diazonium or azinium salt, has a divalent anionic structure. Therefore, the electron density of the counter anion is high, and thermal decomposition of the onium salt is thereby facilitated. In addition, an ordinary light-to-heat conversion agent such as an electrically-charged cyanine dye or oxonole dye can readily interact with an onium salt of this type, and therefore the dye and the initiator are readily localized to thereby increase light-to-heat conversion efficiency of the plate precursor. Accordingly, the initiator can be efficiently decomposed, increasing the recording sensitivity of the plate precursor.

The planographic printing plate precursor of the present invention may be for a "heat-mode exposure system", which means that the plate precursor may be subjected to heat-mode exposure for image formation thereon. A definition of heat-mode exposure is now described in detail. As described by Hans-Joachim Timpe (IS & Ts NIP 15:1999 *International Conference on Digital Printing Technologies*, page 209), it is known that a process featuring photo-excitation of a light-absorbing substance (e.g., dye) in a photographic material followed by a chemical or physical change thereof for image formation in a photosensitive layer of the material (that is, a process of image formation comprising photo-excitation of the light-absorbing substance followed by the chemical or physical change thereof includes two major modes. Specifically, one is a photon mode in which the photo-excited light-absorbing substance in the photographic material is inactivated through some photo-chemical interaction (for example, energy transfer or electron transfer) with another reactive substance in the material, and the reactive substance, having been thus activated as a result of the interaction, undergoes the chemical or physical change necessary for image formation in the photosensitive layer of the material. The other mode is a heat mode in which the photo-excited light-absorbing substance in the photographic material generates heat and is thus inactivated by the heat generation, and the other reactive substance in the material receives the heat and undergoes the chemical or physical change necessary for image formation in the photosensitive layer of the material. Other minor modes of the process, for example, ablation, in which the substances in a photographic material are explosively scattered by locally focused light energy, and poly-photon absorption, in which one molecule in a photographic material absorbs a number of photons at the same time, are omitted herein.

The exposure processes of the modes are referred to as photon-mode exposure and heat-mode exposure. A technical difference between photon-mode exposure and heat-mode exposure is whether or not the energy quantities from a plurality of photons for exposure can be added up for the intended reaction. For example, referred to is a reaction through exposure to a number of photons n. In photon-mode exposure, which takes advantage of photo-chemical interaction of the substances in the photographic material, the energy quantities from n photons cannot be added up for the reaction, because of the laws of quantum energy and momentum conservation. In other words, every reaction through photon-mode exposure requires the condition "quantity of energy of one photon≧quantity of energy for one reaction". On the other hand, in heat-mode exposure, the light-absorbing substance in the photographic material is first photo-excited to generate heat, and the heat, having been thus converted from light energy, serves for the reaction for image formation in the photosensitive layer of the material. Accordingly, in heat-mode exposure, the energy quantities of all n photons can be added up for image formation. Therefore, the condition "energy quantities of n photons≧energy quantity for one reaction" is sufficient for heat-mode exposure. However, the addition of the energy quantities in heat-mode exposure is restricted by heat diffusion. Concretely, when an exposed area (reaction point) of a photographic material successively undergoes a subsequent photo-excitation and inactivation before heat generated by a previous photo-excitation and inactivation step is dispersed by heat diffusion, and therefore that area successively receives heat through subsequent photo-excitations and inactivations, then the heat quantities can be surely accumulated and added up to thereby elevate the temperature of the exposed area. However, when the heat generation in the next step is delayed, the heat generated in the previous step will disperse from the area through heat diffusion. In other words, in heat-mode exposure to a predetermined level of total energy, a case of short-time exposure to higher energy and a case of long-time exposure to lower energy produce different results, and the former case of short-time exposure to higher energy is more advantageous than the latter case.

Photon-mode exposure may also undergo this same phenomenon, of being influenced by subsequent reactions, but is basically free therefrom.

The difference between photon-mode exposure and heat-mode exposure will now be discussed with respect to the characteristics of a photographic material to be processed. In photon-mode exposure, the intrinsic sensitivity (the quantity of energy necessary for the reaction for image formation) of a photographic material is always constant with respect to exposure power density ($W/cm^2$) (=energy density per unit exposure time). In heat-mode exposure, the intrinsic sensitivity increases with an increase in the exposure power density. Now, the exposure time is fixed to be enough for the necessary processability of practicable image-recording materials, and the two modes are compared for the thus-fixed exposure time. In photon-mode exposure, in general, a low degree of energy, about 0.1 $mJ/cm^2$ or so, may be enough for high-sensitivity exposure of the material, but even a slight amount of exposure will cause photo-reaction in the material. Therefore, in this mode, materials often involve a problem of low-exposure fogging in a non-exposed area. On the other hand, in heat-mode exposure, photographic materials do not undergo photo-reaction if the amount of exposure is not above a certain level. In this mode, in general, the photographic material requires a level of exposure energy of 50 $mJ/cm^2$ or so in view of thermal stability, and is therefore free from the problem of low-exposure fogging in the non-exposed area.

In heat-mode exposure, photographic materials require an exposure power density of at least 5,000 $W/cm^2$ on their surface, preferably at least 10,000 $W/cm^2$. Further, although not described in detail herein, high-power density lasers, higher than $5.0 \times 10^5$ $W/cm^2$, are undesirable as they cause ablation and soil light sources and the like.

DETAILED DESCRIPTION OF THE PREFERRED EMBODIMENTS

Components constituting a photosensitive layer of a planographic printing plate precursor of the present invention are now described.

(C) Onium Salt Having a Counter Anion with a Valency of at Least 2

One characteristic component of the photosensitive layer in the planographic printing plate precursor of the present invention is (C) an onium salt having a counter anion having a valency of at least 2 (this will be hereinafter referred to as a polyvalent anionic onium salt (C)).

A cation site of the polyvalent anionic onium salt structure for use in the present invention may include, for example, those of known diazonium salts, iodonium salts, sulfonium salts, ammonium salts, pyridinium salts and azinium salts. Preferred for the cation site structure of the onium salt are those of sulfonium salts, iodonium salts, diazonium salts, azinium salts and ammonium salts.

Concretely, preferred examples of the onium salt are selected from the group consisting of iodonium salts represented by the following general formula (1), diazonium salts represented by the following general formula (2), and sulfonium salts represented by the following general formula (3). Of these, triarylsulfonium salts and diaryliodonium salts are more preferred in view of safety.

$$Ar^{11}—I^{+}—Ar^{12}Z^{11-} \quad (1)$$

$$Ar^{21}—N^{+}\equiv NZ^{21-} \quad (2)$$

(3)

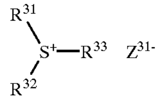

In formula (1), $Ar^{11}$ and $Ar^{12}$ each independently represent an optionally substituted aryl group having at most 20 carbon atoms. Preferred examples of the substituent, if present, of the aryl group include a halogen atom, a nitro group, an alkyl group having at most 12 carbon atoms, an alkoxy group having at most 12 carbon atoms, and an aryloxy group having at most 12 carbon atoms. $Z^{11-}$ represents a counter anion having a valency of at least 2, which will be described in detail hereinunder.

In formula (2), $Ar^{21}$ represents an optionally substituted aryl group having at most 20 carbon atoms. Preferred examples of the substituent for the aryl group include a halogen atom, a nitro group, an alkyl group having at most 12 carbon atoms, an alkoxy group having at most 12 carbon atoms, an aryloxy group having at most 12 carbon atoms, an alkylamino group having at most 12 carbon atoms, a dialkylamino group having at most 12 carbon atoms, an arylamino group having at most 12 carbon atoms, and a diarylamino group having at most 12 carbon atoms. $Z^{21-}$ has the same meaning as $Z^{11-}$, representing a counter ion.

In formula (3), $R^{31}$, $R^{32}$ and $R^{33}$ may be the same or different, each representing an optionally substituted hydrocarbon group having at most 20 carbon atoms. Preferably, $R^{31}$, $R^{32}$ and $R^{33}$ are all aryl groups, each of which may be substituted. Preferred examples of the substituent include a halogen atom, a nitro group, an alkyl group having at most 12 carbon atoms, an alkoxy group having at most 12 carbon atoms, and an aryloxy group having at most 12 carbon atoms. $Z^{31-}$ has the same meaning as $Z^{11-}$, representing a counter ion.

The anionic structure having a valency of at least 2 of the counter ion in the polyvalent anionic onium salt (C) is not specifically defined, but has at least two anionic sites in one molecule. The at least two anionic sites may be the same or different.

The polyvalent anionic structure is preferably a divalent to hexavalent anion, more preferably a divalent, trivalent or tetravalent anion. Most preferably, it is a divalent anion in view of a synthesis process of the onium salt (C).

Preferably, the anionic site is a conjugated base of a carboxylic acid, a sulfonic acid, a phosphonic acid, a phenol or $R_1$—$SO_2$—NH—$R^2$ (in which $R^1$ and $R^2$ each represent a monovalent, non-metallic organic group). In view of the stability and the reactivity of the onium salt having it, more preferred is a conjugated base of a carboxylic acid, or a conjugated base of a sulfonic acid. Most preferred is a conjugated base of oxalic acid.

Examples of the divalent, trivalent and tetravalent anionic structures preferred for use in the present invention are mentioned below, to which, however, the present invention is not limited.

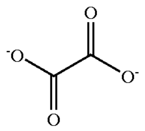
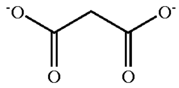
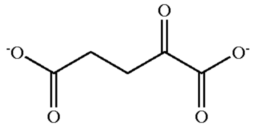
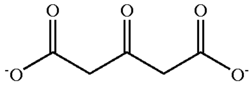
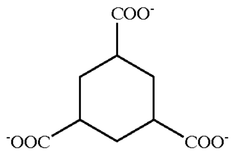
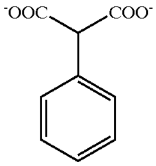
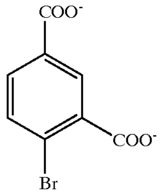
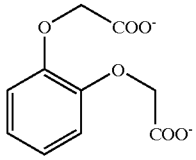
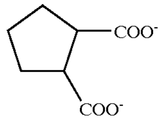
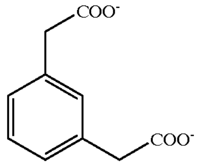
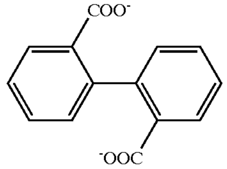
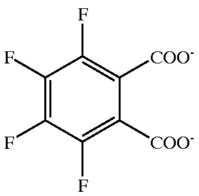

-continued

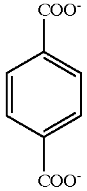
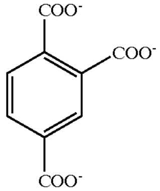
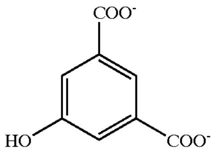
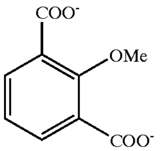
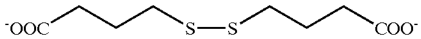
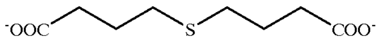

$^{-}OOC—(CF_2)_2—COO^{-}$ $^{-}OOC—(CF_2)_{10}—COO^{-}$

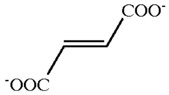
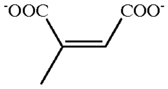
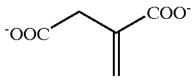
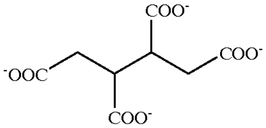
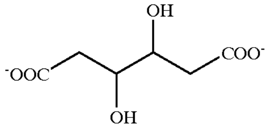
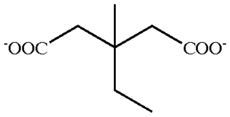
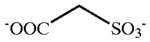
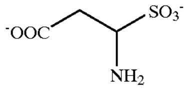
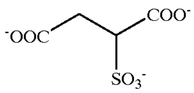
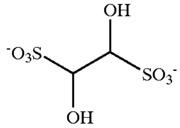
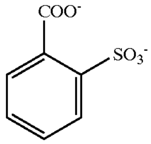
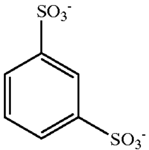
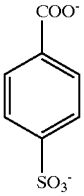
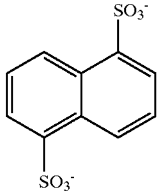
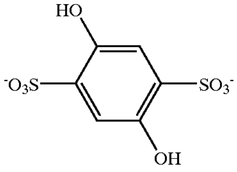

The cation sites of the onium salt mentioned hereinabove are applied as counter cations of these divalent, trivalent and tetravalent counter anionic structures. The onium salt may have matching cations, or two or more different types of cations combined. The polyvalent anionic onium salt in the present invention may be a mixture of such an onium salt having matching cations and an onium salt having two or more different types of cations combined.

Examples of the divalent, trivalent or tetravalent anionic structure-having onium salt preferred for use in the present invention are mentioned below, to which, however, the present invention is not limited. Compounds (SA-1) to (SD-8) mentioned below are examples of a sulfonium salt compound having a divalent anionic structure and matching cationic structure; compounds (SE-1) to (SG-6) are examples of a sulfonium salt compound having a divalent anionic structure and different types of cationic structures; compounds (SH-1) to (SH-3) are examples of a sulfonium salt compound having a trivalent anionic structure and matching cationic structure; and compounds (SI-1) and (SI-2) are examples of a sulfonium salt compound having a tetravalent anionic structure and matching cationic structure.

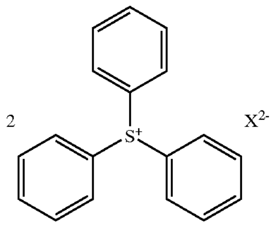

$X^{2-}$:

(SA-1)

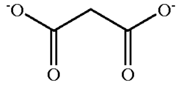

(SA-2)

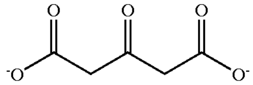

(SA-3)

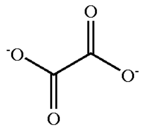

(SA-4)

$^-OOC—(CH_2)_{10}—COO^-$ (SA-5)

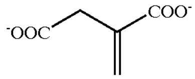

(SA-6)

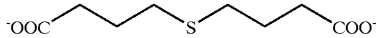

(SA-7)

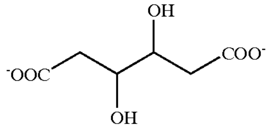

(SA-8)

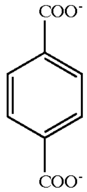

(SA-9)

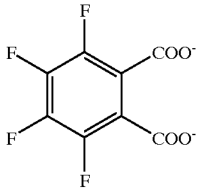

-continued (SA-10)

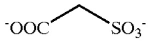

(SA-11)

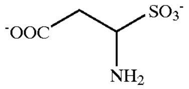

(SA-12)

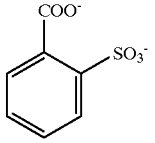

(SA-13)

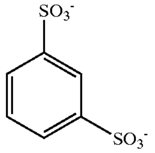

(SA-14)

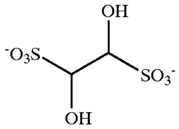

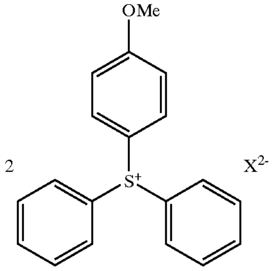

$X^{2-}$:

(SB-1)

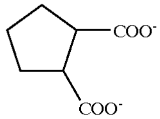

(SB-2)

$^-OOC—(CF_2)_2—COO^-$ (SB-3)

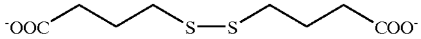

(SB-4)

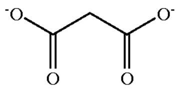

(SB-5)

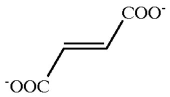

(SB-6)

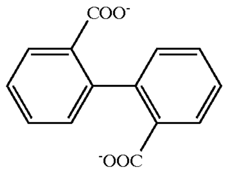

-continued
(SB-7)
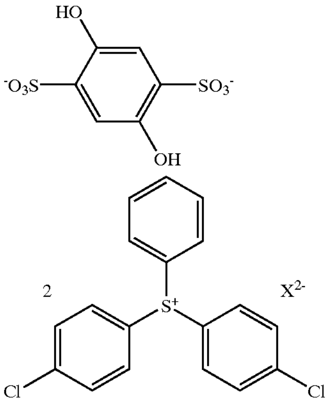
$X^{2-}$:
(SC-1)
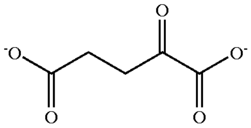
(SC-2)
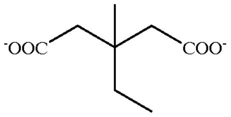
(SC-3)
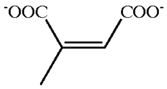
(SC-4)
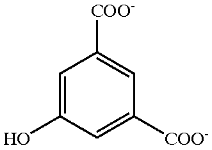
(SC-5)
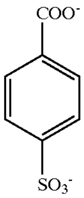
(SC-6)
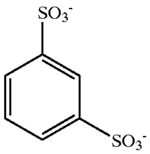
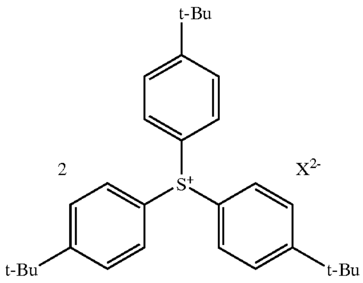
-continued
$X^{2-}$:
(SD-1)
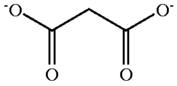
(SD-2)
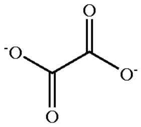
(SD-6)
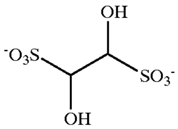
(SD-3)
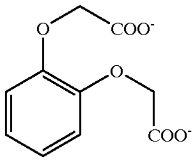
(SD-4)
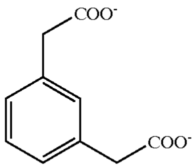
(SD-5)
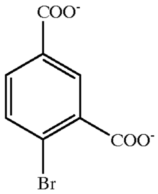
(SD-7)
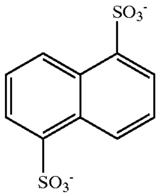
(SD-8)
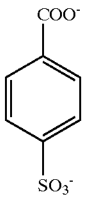
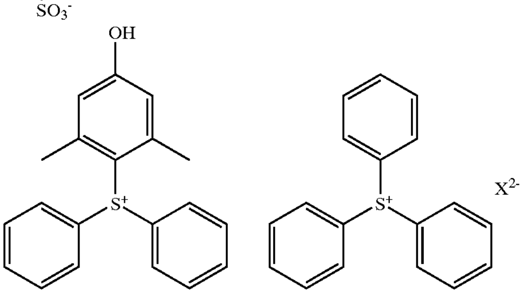

-continued
$X^{2-}$:
(SE-1)
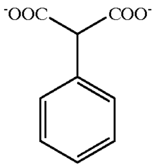
(SE-2)
$^{-}OOC—(CF_2)_2—COO^{-}$
(SE-3)
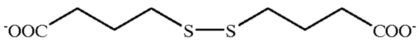
(SE-4)
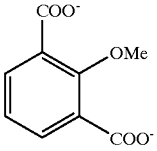
(SE-5)
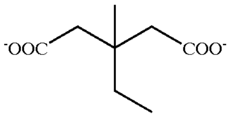
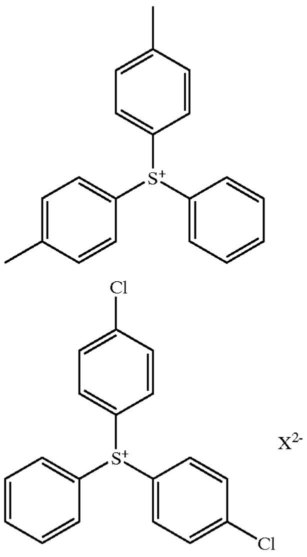
$X^{2-}$:
(SF-1)
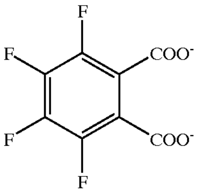
(SF-2)
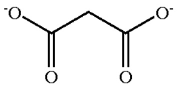
-continued
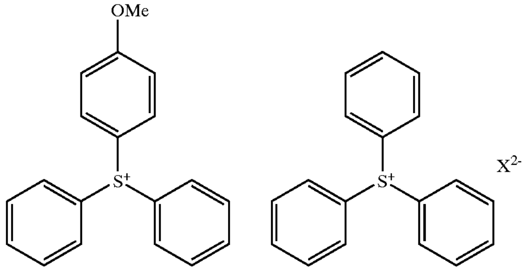
$X^{2-}$:
(SG-1)
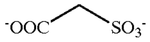
(SG-2)
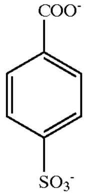
(SG-3)
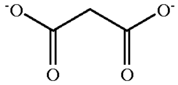
(SG-4))
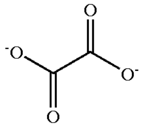
(SG-5)
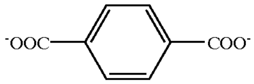
(SG-6)
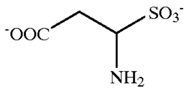
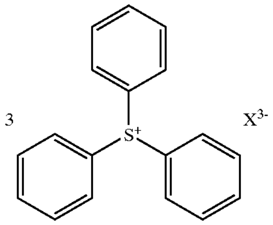
$X^{3-}$:
(SH-1)
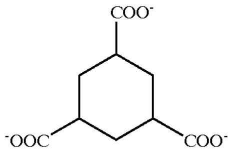
(SH-2)
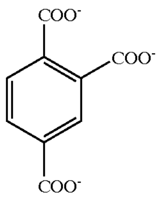

-continued (SH-3)

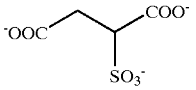

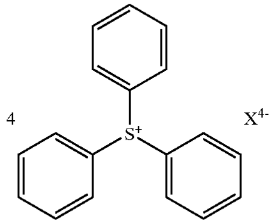

$X^{4-}$:

(SI-1)

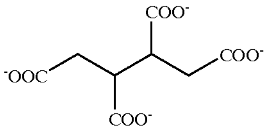

(SI-2)

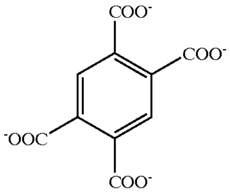

Compounds (IA-1) to (IF-8) mentioned below are examples of an iodonium salt compound having a divalent anionic structure and matching cationic structure; compounds (IG-1) to (IH-7) are examples of an iodonium salt compound having a divalent anionic structure and different types of cationic structures; compounds (IJ-1) to (IJ-3) are examples of an iodonium salt compound having a trivalent anionic structure; and compounds (IK-1) and (IK-2) are examples of an iodonium salt compound having a tetravalent anionic structure.

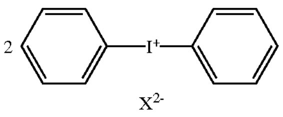

$X^{2-}$:

(IA-1)

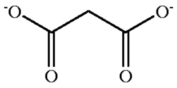

(IA-2)

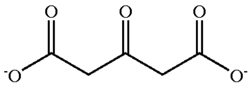

(IA-3)

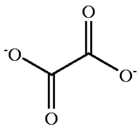

(IA-4)

$^{-}OOC-(CH_2)_{10}-COO^{-}$ (IA-5)

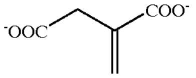

-continued (IA-6)

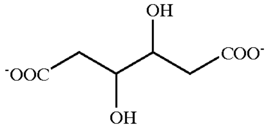

(IA-7)

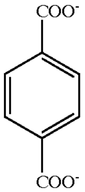

(IA-8)

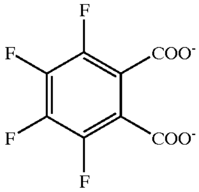

(IA-9)

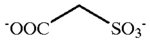

(IA-10)

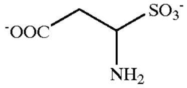

(IA-11)

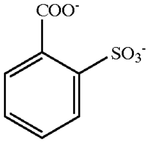

(IA-12)

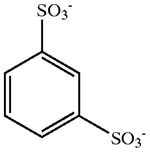

(IA-13)

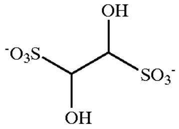

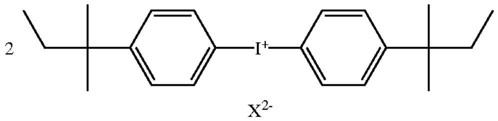

$X^{2-}$:

(IB-1)

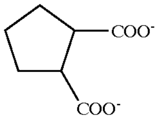

(IB-2)

$^{-}OOC-(CF_2)_2-COO^{-}$ (IB-3)

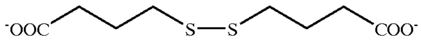

-continued
(IB-4)
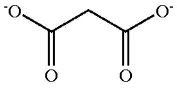
(IB-5)
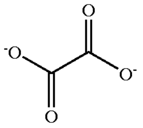
(IB-6)
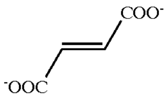
(IB-7)
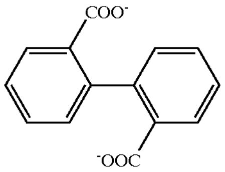
(IB-8)
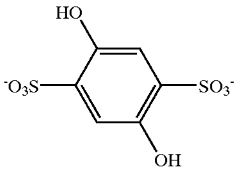
(IB-9)
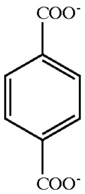
(IB-10)
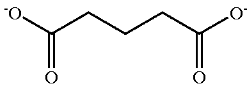
(IB-11)
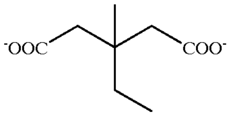
(IB-12)
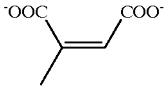
(IB-13)
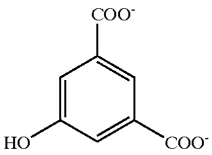
(IB-14)
-continued
(IB-15)
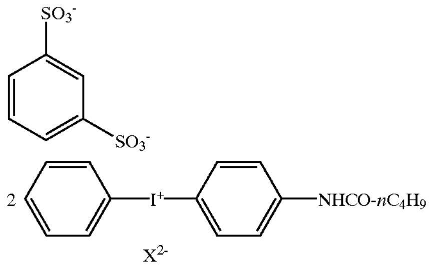
$X^{2-}$:
(IC-1)
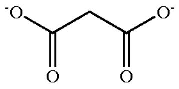
(IC-2)
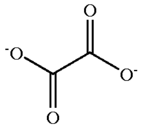
(IC-3)
$^-OOC—(CH_2)_{10}—COO^-$
(IC-4)
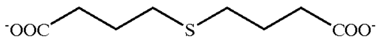
(IC-5)
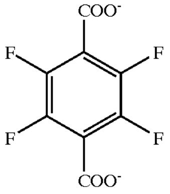
(IC-6)
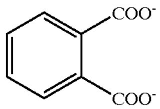
(IC-7)
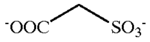
(IC-8)
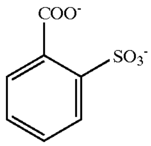
(IC-9)
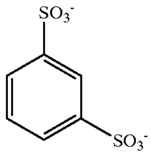
(IC-10)
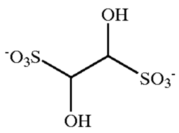
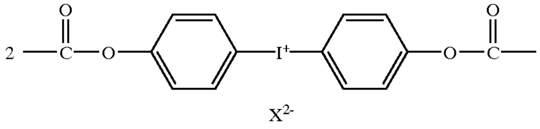

-continued
$X^{2-}$:
(ID-1)
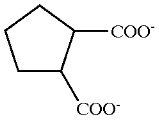
(ID-2)
$^{-}OOC—(CF_2)_2—COO^{-}$
(ID-3)
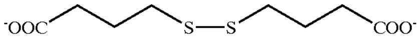
(ID-4)
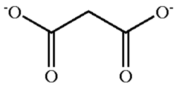
(ID-5)
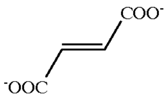
(ID-6)
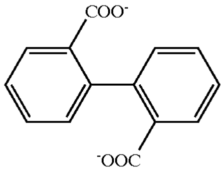
(ID-7)
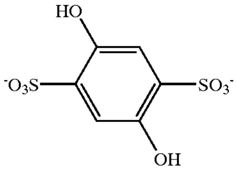
2 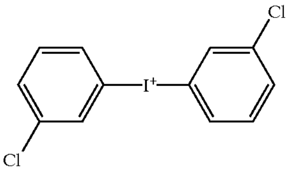
$X^{2-}$
$X^{2-}$:
(IE-1)
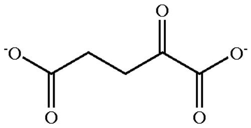
(IE-2)
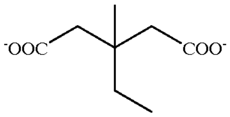
(IE-3)
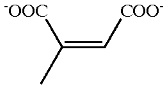
(IE-4)
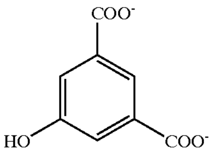
-continued
(IE-5)
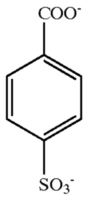
(IE-6)
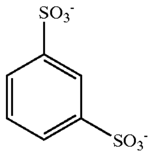
2 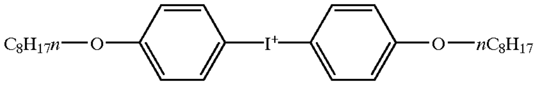
$X^{2-}$
$X^{2-}$:
(IF-1)
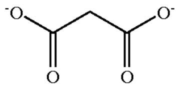
(IF-2)
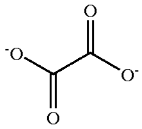
(IF-3)
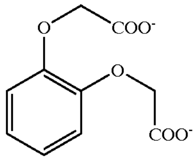
(IF-4)
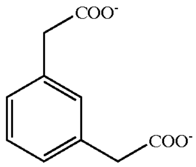
(IF-5)
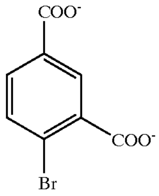
(IF-6)
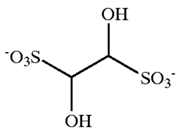

-continued
(IF-7)
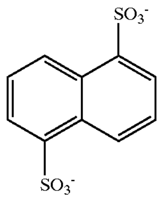
(IF-8)
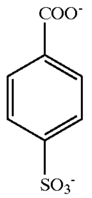
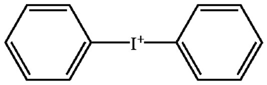
$X^{2-}$
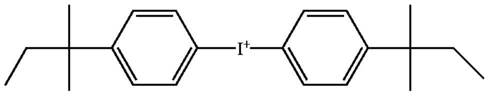
$X^{2-}$:
(IG-1)
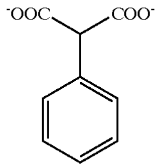
(IG-2)
$^-OOC—(CF_2)_2—COO^-$
(IG-3)
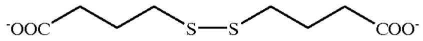
(IG-4)
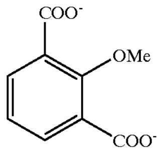
(IG-5)
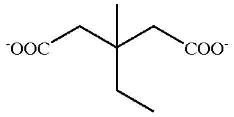
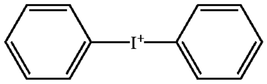
$X^{2-}$
$X^{2-}$:
(IH-1)
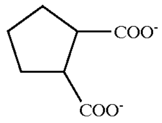
(IH-2)
$^-OOC—(CF_2)_2—COO^-$
-continued
(IH-3)
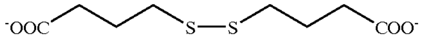
(IH-4)
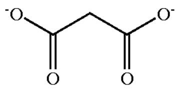
(IH-5)
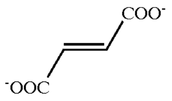
(IH-6)
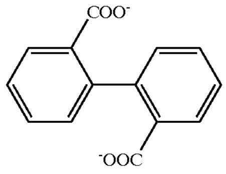
(IH-7)
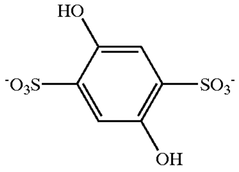
3 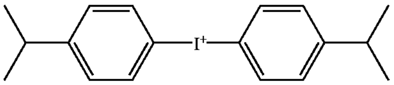 $X^{3-}$
$X^{3-}$:
(IJ-1)
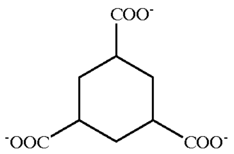
(IJ-2)
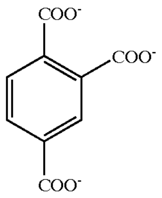
(IJ-3)
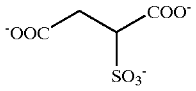
4 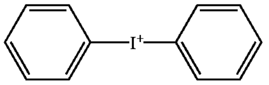 $X^{4-}$
$X^{4-}$:
(IK-1)
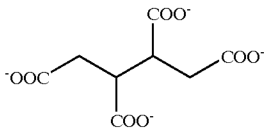

-continued (IK-2)

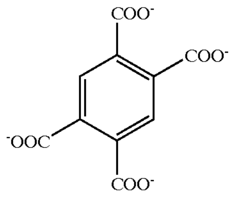

Compounds (ISA-1) to (ISB-6) mentioned below are examples of an onium salt compound having a divalent anionic structure and having sulfonium and iodonium for the cationic structures.

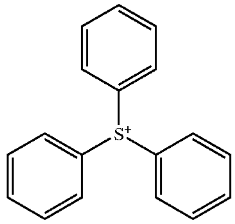

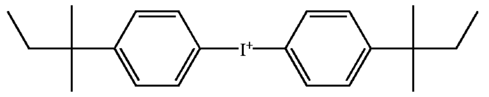

$X^{2-}$ $X^{2-}$:

(ISA-1)

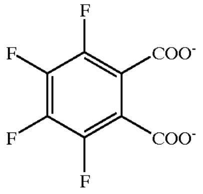

(ISA-2)

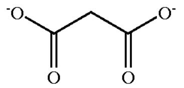

(ISA-3)

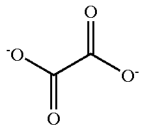

(ISA-4)

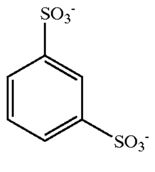

(ISA-5)

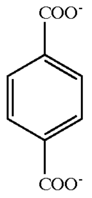

-continued

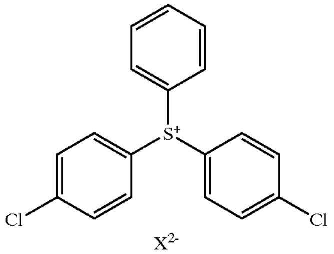

$X^{2-}$

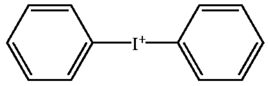

$X^{2-}$:

(ISB-1)

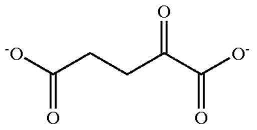

(ISB-2)

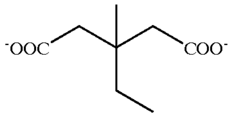

(ISB-3)

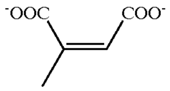

(ISB-4)

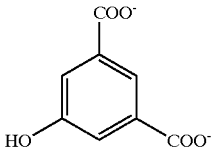

(ISB-5)

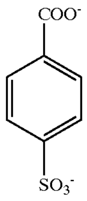

(ISB-6)

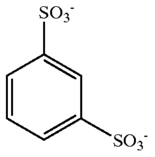

Preferably, the onium salt for use in the present invention has a maximum absorption wavelength of at most 400 nm, more preferably at most 360 nm. By including an onium salt of this type, having absorption in a UV wavelength range, the image-recording material can be handled even under white lights.

Typical examples of production of the polyvalent anionic onium salt (C) are shown below.

PRODUCTION EXAMPLE 1

Production of Polyvalent Anionic Onium Salt Compound (SA-3)

50.9 g of diphenyl sulfoxide was dissolved in 800 ml of benzene, to which was added 200 g of aluminium chloride, and this was refluxed for 24 hours. While being cooled with ice, the reaction liquid was gradually poured into 2 liters of water, to which was then added 400 ml of concentrated hydrochloric acid, and this was heated at 70° C. for 10 minutes. The resulting aqueous solution was washed with 500 ml of ethyl acetate and filtered, and a solution of 200 g of ammonium iodide in 400 ml of water was added thereto.

A deposited powdery solid was taken out through filtration, washed with water and then with ethyl acetate, and dried to obtain 70 g of triphenylsulfonium iodide. 30.5 g of the triphenylsulfonium iodide was dissolved in 1000 ml of methanol, to which was added 19.1 g of silver oxide, and this was stirred at room temperature for 4 hours. The solution was filtered, and 3.2 g of oxalic acid was added. The reaction liquid was concentrated, and the concentrate was washed with ethyl acetate and hexane, and then dried in vacuum to obtain a sulfonium salt, Compound (SA-3). Yield was 91%.

PRODUCTION EXAMPLE 2

Production of Polyvalent Anionic Onium Salt Compound (IB-14)

60 g of t-amylbenzene, 39.5 g of potassium iodate, 81 g of acetic anhydride, and 170 ml of dichloromethane were mixed, and to this was gradually dropwise added 66.8 g of concentrated sulfuric acid while being cooled with ice. This was stirred for 2 hours while being cooled with ice, and then for 10 hours at room temperature.

While being cooled with ice, 500 ml of water was added to the reaction liquid that had been stirred for 10 hours at room temperature, and a component dissolved in the reaction liquid was extracted with dichloromethane. The dichloromethane-containing organic phase was washed with aqueous sodium hydrogencarbonate and then with water. After being thus washed, the organic phase was concentrated to obtain di(4-t-amylphenyl)iodonium sulfate. The sulfate was put into an excess amount of aqueous potassium iodide. The resulting aqueous solution was extracted with dichloromethane and washed with water, and this organic phase was concentrated to obtain di(4-t-amylphenyl)iodonium iodide. The yield was 75 g.

42.2 g of di(4-t-amylphenyl)iodonium iodide obtained in the above manner was dissolved in 2000 ml of methanol, to which was added 19.1 g of silver oxide, and this was stirred for 4 hours at room temperature. The resulting solution was filtered, and 12 g of dipotassium 1,3-benzenedisulfonate was added thereto. The reaction liquid was concentrated, and the concentrate was washed with ethyl acetate and hexane, and then dried in vacuum to obtain an iodonium salt, Compound (IB-14). The yield was 85%.

Other sulfonium salts and iodonium salts can be produced in the same manner as above. Other methods also employable herein for producing iodonium iodides are described, for example, in *Bull. Chem. Soc.*, Jpn 70, 219–224 (1997); *Bull. Chem. Soc.*, Jpn 70, 1665–1669 (1997); *Bull Chem. Soc.*, Jpn 70, 115–120 (1999); *J. Amer. Chem. Soc.*, 82, 1960, 725–731; and *J. Amer. Chem. Soc.*, 81, 1959, 342–346.

Other methods also employable herein for producing sulfonium iodides are described, for example, in *J. Amer. Chem. Soc.*, 91, 1969, 145–150.

The amount of the polyvalent anionic onium salt to be in the photosensitive layer in the present invention is preferably from 0.1 to 40% by weight of the total solid content of the layer, more preferably from 0.5 to 30% by weight, and even more preferably from 1 to 25% by weight. If the amount added is smaller than 0.1% by weight, the layer can not cure well; but if it is larger than 40%, a low-molecular component in the layer will be too large and the mechanical strength of a cured film of the layer will be low.

Optionally, the polyvalent anionic onium salt mentioned above may be combined with a known thermal radical generator, which serves as a polymerization initiator for initiating and promoting polymerization of the polymerizable unsaturated group-having compound in the photosensitive layer, provided this does not interfere with the effects of the present invention. The radical initiator may be any known thermal polymerization initiator or any known compound requiring small association-dissociation energy. For example, preferred is a compound having the onium salt structure as above but having a monovalent counter anion.

In cases where such an ordinary onium salt having a monovalent counter anion is used in the present invention, the amount thereof in the photosensitive layer is preferably from 0.05 to 40% by weight relative to the polyvalent anionic onium salt (C) in the layer.

(A) Light-to-Heat Conversion Agent

The light-to-heat conversion agent in the photosensitive layer of the present invention is not specifically defined in point of its absorption wavelength range, and may be any agent having a function of converting light which it has absorbed into heat for image formation in the layer. As the light-to-heat conversion agent used in the present invention, preferred are IR-absorbing dyes and pigments that have an absorption peak in a wavelength range of from 760 nm to 1200 nm, which are suitable with easily-available high-power lasers.

The dye may be any of commercially-available dyes and other known dyes, for example, those described in *Dye Handbook* (the Association of Organic Synthetic Chemistry of Japan, 1970). Concretely, these include azo dyes, metal-complex azo dyes, pyrazolonazo dyes, naphthoquinone dyes, anthraquinone dyes, phthalocyanine dyes, carbonium dyes, quinonimine dyes, methine dyes, cyanine dyes, squarylium dyes, pyrylium salts, metal thiolate complexes, oxonole dyes, diimmonium dyes, aminium dyes and croconium dyes.

Preferred dyes for use herein are cyanine dyes such as those described in JP-A 58-125246, 59-84356, 59-202829, and 60-78787; methine dyes as in JP-A 58-173696, 58-181690, and 58-194595; naphthoquinone dyes as in JP-A 58-112793, 58-224793, 59-48187, 59-73996, 60-52940, and 60-63744; squarylium dyes as in JP-A 58-112792; and cyanine dyes as in British Patent No. 434,875.

Also preferred for use herein are near-IR absorbing sensitizers such as those described in U.S. Pat. No. 5,156,938; substituted arylbenzo(thio)pyrylium salts as in U.S. Pat. No. 3,881,924; trimethine-thiapyrylium salts as in JP-A 57-142645 (U.S. Pat. No. 4,327,169); pyrylium compounds as in JP-A 58-181051, 58-220143, 59-41363, 59-84248, 59-84249, 59-146063, and 59-146061; cyanine dyes as in JP-A 59-216146; pentamethine-thiopyrylium salts as in U.S. Pat. No. 4,283,475; and pyrylium compounds as in JP-B 5-13514, and 5-19702.

Other examples preferred for the dyes for use herein are near-IR absorbing dyes of formulae (I) and (II) in U.S. Pat. No. 4,756,993.

Of these dyes, especially preferred are cyanine colorants, phthalocyanine dyes, oxonole dyes, squarylium colorants, pyrylium salts, thiopyrylium dyes, and nickel-thiolate complexes. More preferred are dyes of general formulae (a) to (e) mentioned below, which ensure good light-to-heat conversion efficiency. Most preferred are the cyanine dyes of formula (a), which ensure high polymerization activity when used in the polymerizable composition of the present invention, and are stable and economical.

Formula (a)

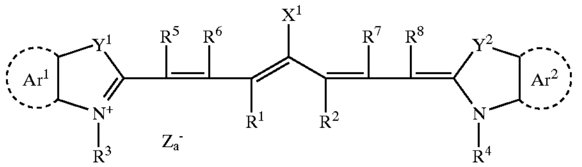

In formula (a), $X^1$ represents a hydrogen atom, a halogen atom, —$NPh_2$, $X^2$-$L^1$, or the following group.

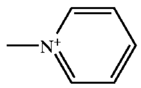

$X^2$ represents an oxygen or sulfur atom; $L^1$ represents a hydrocarbon group having from 1 to 12 carbon atoms, or a hetero atom-containing aromatic group, or a hetero atom-containing hydrocarbon group having from 1 to 12 carbon atoms. The hetero atom includes N, S, O, halogen atoms, and Se.

$R^1$ and $R^2$ each independently represent a hydrocarbon group having from 1 to 12 carbon atoms. In view of storage stability of a coating liquid for the photosensitive layer containing the dye, $R^1$ and $R^2$ are each preferably a hydrocarbon group having at least 2 carbon atoms; more preferably, $R^1$ and $R^2$ are bonded to each other to form a 5-membered or 6-membered ring.

$Ar^1$ and $Ar^2$ may be the same or different, and each represents an optionally substituted aromatic hydrocarbon group. Preferably, the aromatic hydrocarbon group is a benzene ring or a naphthalene ring. Preferred substituents are a hydrocarbon group having at most 12 carbon atoms, a halogen atom, and an alkoxy group having at most 12 carbon atoms. $Y^1$ and $Y^2$ may be the same or different, and each represents a sulfur atom or a dialkylmethylene group having at most 12 carbon atoms. $R^3$ and $R^4$ may be the same or different, and each represents an optionally substituted hydrocarbon group having at most 20 carbon atoms. Preferred substituents are an alkoxy group having at most 12 carbon atoms, a carboxyl group, and a sulfo group. $R^5$, $R^6$, $R^7$ and $R^8$ may be the same or different, and each represents a hydrogen atom or a hydrocarbon group having at most 12 carbon atoms. Preferably, these are hydrogen atoms, in view of starting materials for the dye being easily available. $Z_a^-$ represents a counter anion. However, in cases where any of $R^1$ to $R^8$ is substituted with a sulfo group, $Z_a^-$ is unnecessary. In view of the storage stability of the coating liquid for the photosensitive layer containing the dye, $Z_a^-$ is preferably a halide ion, a perchlorate ion, a tetrafluoroborate ion, a hexafluorophosphate ion, or a sulfonate ion, and more preferably a perchlorate ion, a hexafluorophosphate ion or an arylsulfonate ion.

Examples of the cyanine dyes of formula (a) preferred for use in the present invention are mentioned below. In addition to these, also preferred for use herein are the dyes described in paragraphs [0017] to [0019] in Japanese Patent Application No. 11-310623, paragraphs [0012] to [0038] in Japanese Patent Application No. 2000-224031, and paragraphs [0012] to [0023] in Japanese Patent Application No. 2000-211147.

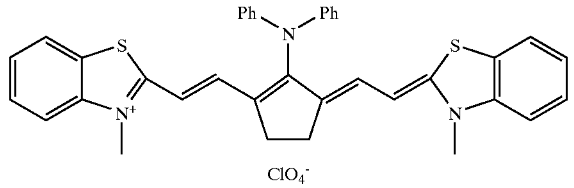

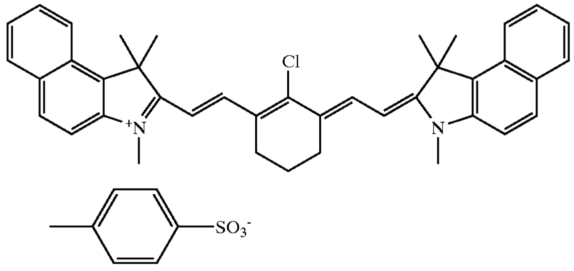

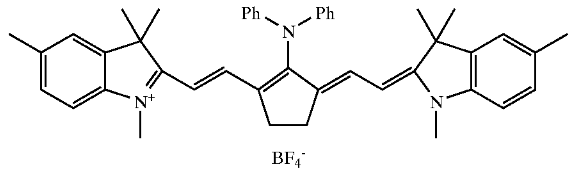

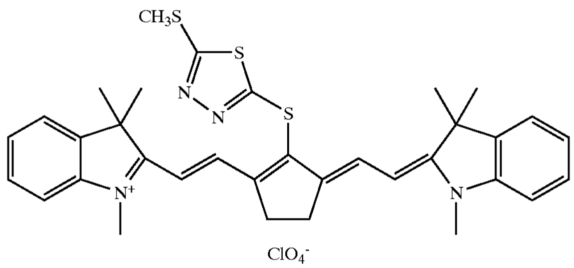

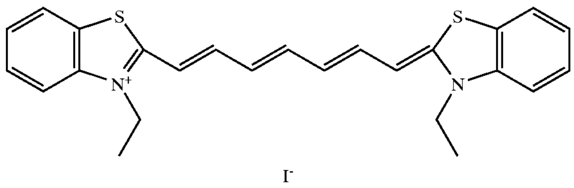

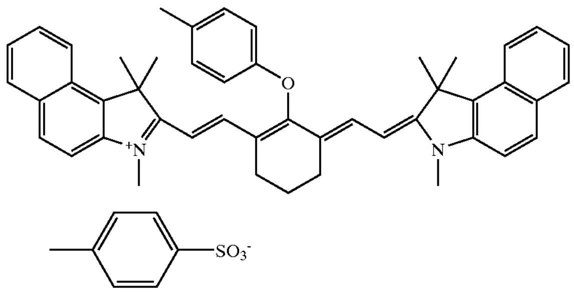

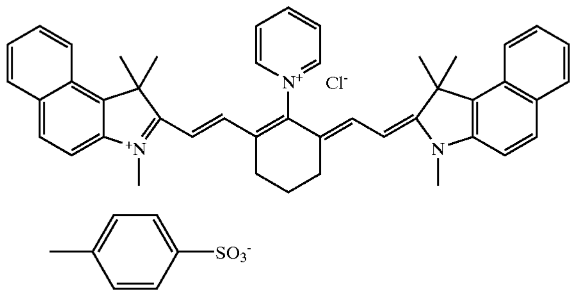

-continued

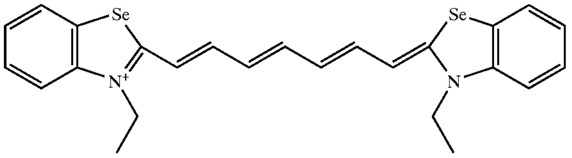

I⁻

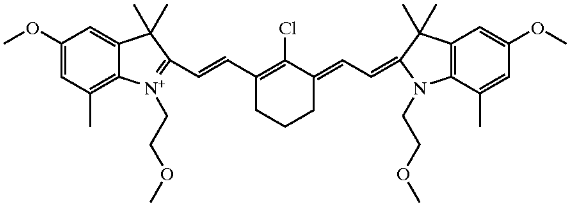

$BF_4^-$

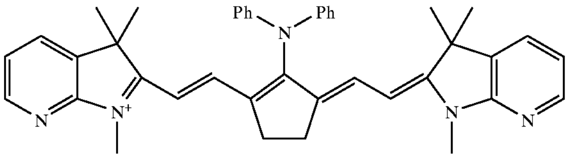

$BF_4^-$

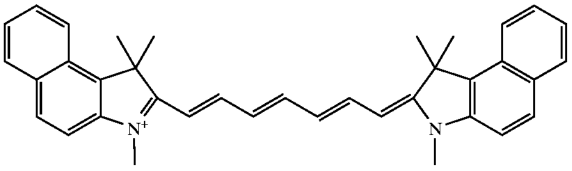

$ClO_4^-$

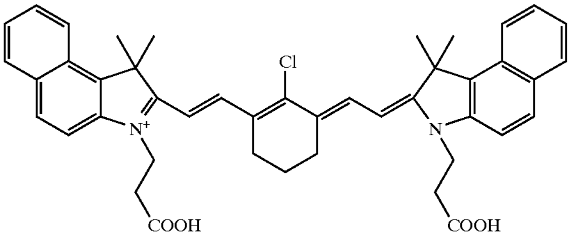

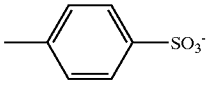

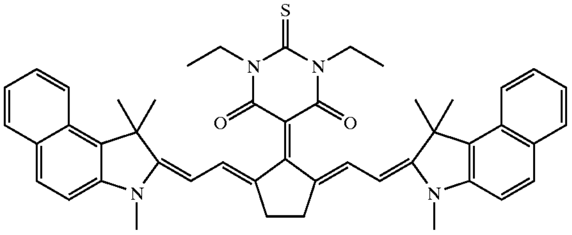

Formula (b)

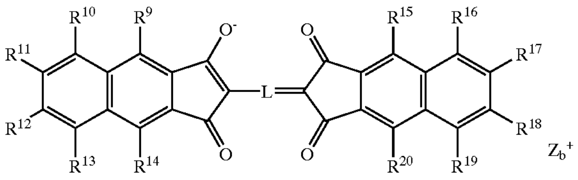

In formula (b), L represents a methine chain having at least 7 conjugated carbon atoms, and this methine chain may be substituted. The substituents, if present, of the methine chain may be bonded to each other to form a cyclic structure. $Z_b^+$ represents a counter cation. Preferred examples of the counter cation are ammonium, iodonium, sulfonium, phosphonium, pyridinium, and alkali metal cations ($Ni^+$, $K^+$, $Li^+$). $R^9$ to $R^{14}$, and $R^{15}$ to $R^{20}$ each independently represent a hydrogen atom or a substituent selected from halogen atoms, cyano groups, alkyl groups, aryl groups, alkenyl groups, alkynyl groups, carbonyl groups, thio groups, sulfonyl groups, sulfinyl groups, oxy groups and amino groups, or a substituent of two or three of these groups combined; these may be bonded to each other to form a cyclic structure. Of the dyes of formula (b), preferred are those in which L is a methine chain having 7 conjugated carbon atoms, and $R^9$ to $R^{14}$ and $R^{15}$ to $R^{20}$ are all hydrogen atoms, in view of being easily available and effective.

Examples of the dyes of formula (b) preferred for use in the present invention are mentioned below.

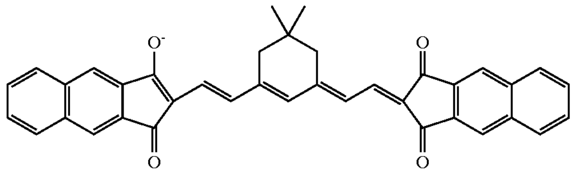

$n\text{-}Bu_4N^+$

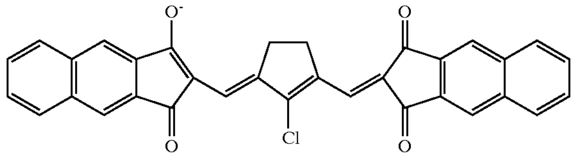

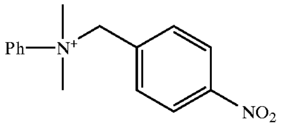

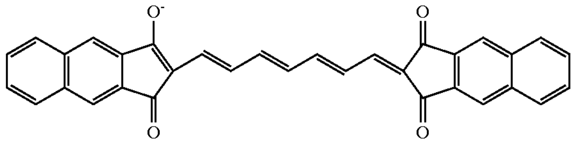

$Me_4N^+$

Formula (c)

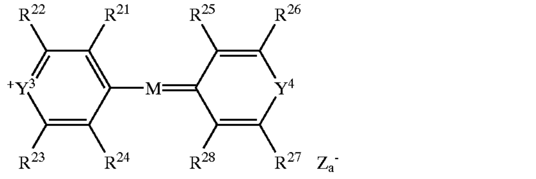

In formula (c), $Y^3$ and $Y^4$ each represent an oxygen atom, a sulfur atom, a selenium atom, or a tellurium atom; M represents a methine chain having at least 5 conjugated carbon atoms; $R^{21}$ to $R^{24}$, and $R^{25}$ to $R^{28}$ may be the same or different, each representing a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; $Z_a^-$ represents a counter anion, having the same meaning as in formula (a).

Examples of the dyes of formula (c) preferred for use in the present invention are mentioned below.

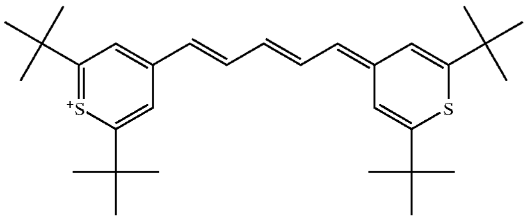

$BF_4^-$

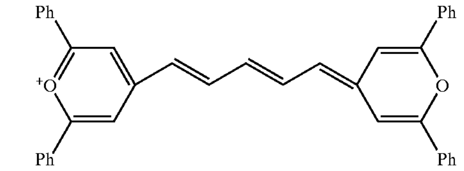

$ClO_4^-$

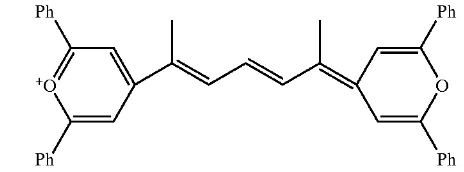

$PF_6^-$

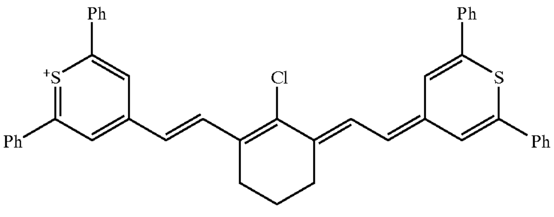

$BF_4^-$

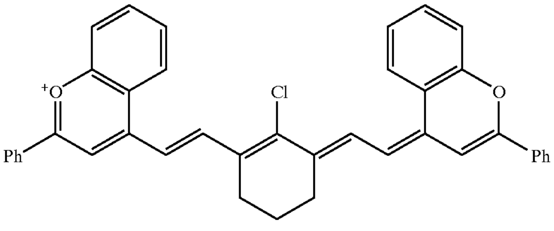

$ClO_4^-$

Formula (d)

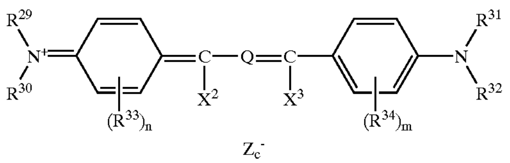

$Z_c^-$

In formula (d), $R^{29}$ to $R^{32}$ each independently represent a hydrogen atom, an alkyl group or an aryl group; $R^{33}$ and $R^{34}$ each independently represent an alkyl group, a substituted oxy group, or a halogen atom; n and m each independently represent an integer of from 0 to 4. $R^{29}$ and $R^{30}$, and $R^{31}$ and $R^{32}$ may be bonded to each other to form a ring. $R^{29}$ and/or $R^{30}$ may be bonded to $R^{33}$, and $R^{31}$ and/or $R^{32}$ to $R^{34}$, to form a ring. Plural $R^{33}$'s or $R^{34}$'s, if any, may be bonded to each other to form a ring. $X^2$ and $X^3$ each independently represent a hydrogen atom, an alkyl group or an aryl group; and at least one of $X^2$ and $X^3$ is a hydrogen atom or an alkyl group. Q represents an optionally substituted trimethine or pentamethine group, and may form a cyclic structure with a divalent organic group. $Z_a^-$ represents a counter anion, having the same meaning as that of $Z_a^-$ in formula (a).

Examples of the dyes of formula (d) preferred for use in the present invention are mentioned below.

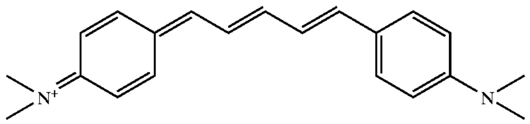

$ClO_4^-$

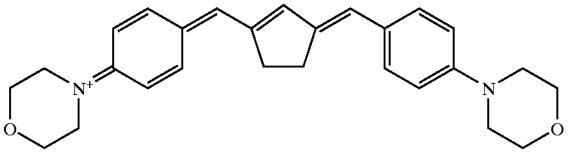

$BF_4^-$

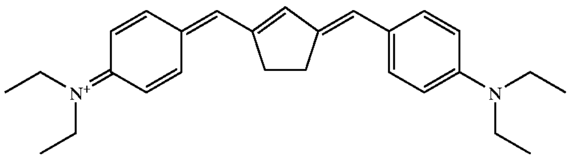

$PF_6^-$

Formula (e)

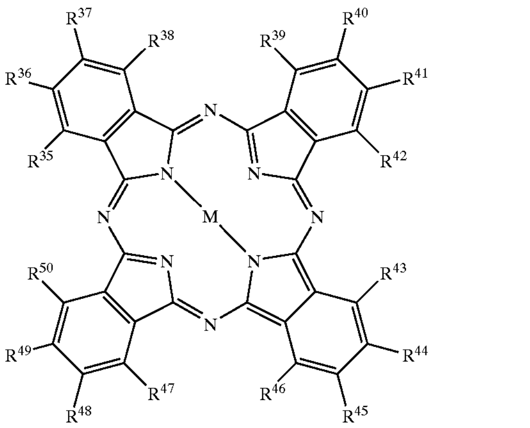

In formula (e), $R^{35}$ to $R^{50}$ each independently represent a hydrogen atom, a halogen atom, a cyano group, an alkyl group, an aryl group, a alkenyl group, an alkynyl group, a hydroxyl group, a carbonyl group, a thio group, a sulfonyl group, a sulfinyl group, an oxy group, an amino group, or an onium salt structure, which may be substituted. M represents two hydrogen atoms, or a metal atom, a halometal group or an oxymetal group, in each of which the metal atom includes atoms of Groups IA, IIA, IIIB and IVB and transition metals and lanthanoid elements of Periods 1, 2 and 3 of the Periodic Table. Of those, especially preferred are copper, magnesium, iron, zinc, cobalt, aluminium, titanium and vanadium.

Examples of the dyes of formula (e) preferred for use in the present invention are mentioned below.

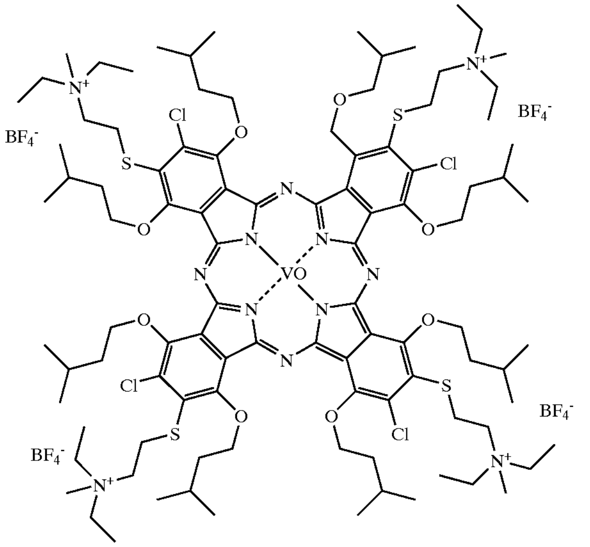

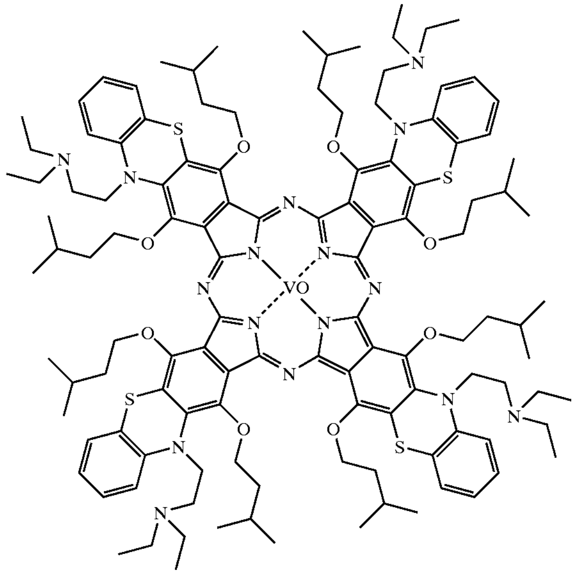

A pigment for use as the light-to-heat conversion agent in the present invention may be any of commercially-available pigments and any of other known pigments, for example, those described in *Color Index* (*C.I.*)*Handbook; Latest Pigment Handbook* (the Pigment Technology Association of Japan, 1977); *Latest Pigment Application Technology* (CMC, 1986); and *Printing Ink Technology* (CMC, 1984).

Various types of pigments are usable herein, including, for example, black pigments, yellow pigments, orange pigments, brown pigments, red pigments, violet pigments, blue pigments, green pigments, fluorescent pigments, metal powder pigments, and other polymer-bonded pigments. Concretely, these include insoluble azo pigments, azo-lake pigments, condensed azo pigments, chelate-azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. Of these, preferred is carbon black.

These pigments may be used without being surface-treated, or may be surface-treated. Surface treatment methods include a method of coating surfaces with resin or wax; a method of adhering a surfactant; and a method of bonding a reactive substance (e.g., a silane coupling agent, epoxy compound, or polyisocyanate) to the surfaces. The methods of surface treatment are described in *Properties and Applications of Metal Soaps* (Miyuki Publishing); *Printing Ink Technology* (CMC, 1984); and *Latest Pigment Application Technology* (CMC, 1986).

Particle size of a pigment for use herein is preferably from 0.01 μm to 10 μm, more preferably from 0.05 μm to 1 μm, and even more preferably from 0.1 μm to 1 μm. If the particle size is smaller than 0.01 μm, the pigment dispersion will be unstable in the coating liquid for the image-forming photosensitive layer; but if larger than 10 μm, the pigment dispersion will interfere with the uniformity of the image-forming photosensitive layer.

For dispersing the pigment, employable is any dispersion technique for ordinary ink production or toner production known in the art. A dispersing machine therefor includes, for example, ultrasonic dispersers, sand mills, attritors, pearl mills, super mills, ball mills, impellers, dispersers, KADY mills, colloid mills, dynatrons, three-roll mills, and pressure kneaders. The details of pigment dispersion are described in *Latest Pigment Application Technology* (CMC, 1986).

In the present invention, one or more different types of the above light-to-heat conversion agents may be used, singly or in a combination of two or more. From the viewpoint of sensitivity, most preferred is a combination of the dye of formula (a) and the iodonium salt or sulfonium salt of formula (1) or (2).

The light-to-heat conversion agent may be added to one photosensitive layer of the negative planographic printing plate precursor along with the other components, or may be in a separate layer of the plate precursor. Preferably, the photosensitive layer of the plate precursor that contains the light-to-heat conversion agent is designed such that its optical density is from 0.1 to 3.0 at an absorption peak in a wavelength range of from 760 nm to 1200 nm. If the optical density of the photosensitive layer is outside this range, the sensitivity will be low. The optical density is determined based on the amount of the IR absorbent in the image-recording photosensitive layer and the thickness of the layer. Therefore, the desired optical density of the photosensitive layer may be attained by controlling these two conditions. The optical density of the photosensitive layer may be measured in any ordinary manner. For example, a photosensitive layer, whose dry thickness is suitably controlled to satisfy the requirements of planographic printing plates, is formed on a transparent or white support, and its optical density is measured with a transmission densitometer; or such a photosensitive layer is formed on a reflective support of, for example, aluminium, and the reflection density of the layer is measured.

(B) Polymerizable Unsaturated Group-Having Compound

The polymerizable unsaturated group-having compound for use in the present invention is an addition-polymerizable compound having at least one ethylenically unsaturated double bond, preferably selected from compounds having at least one, more preferably at least two, terminal ethylenically unsaturated bonds. Compounds of this kind are well known in the art, and any of them are usable herein with no specific limitation. These have various chemical forms, including, for example, monomers, prepolymers (e.g., dimers, trimers, oligomers), and mixtures and copolymers thereof. Examples of monomers and copolymers thereof include unsaturated carboxylic acids (e.g., acrylic acid, methacrylic acid, itaconic acid, crotonic acid, isocrotonic acid, maleic acid), and their esters and amides. Preferred are esters of unsaturated carboxylic acids with aliphatic polyalcohols, and amides of unsaturated carboxylic acids with aliphatic polyamines. Also preferred are adducts of an unsaturated carboxylate or amide having a nucleophilic substituent of, for example, a hydroxyl, amino or mercapto group, with a monofunctional or polyfunctional isocyanate or epoxide; and dehydrated condensates of monofunctional or polyfunctional carboxylic acids.

Also preferred are adducts of an unsaturated carboxylate or amide having an electrophilic substituent of, for example, an isocyanate or epoxy group, with a monofunctional or polyfunctional alcohol, amine or thiol; and substitution reaction products of an unsaturated carboxylate or amide having a leaving substituent of, for example, a halogen or tosyloxy group, with a monofunctional or polyfunctional alcohol, amine or thiol. Also usable herein are other groups of compounds, for which are used unsaturated phosphonic acids, styrenes or vinyl ethers in place of the unsaturated carboxylic acids.

Examples of esters of aliphatic polyalcohols with unsaturated carboxylic acids for use as the polymerizable unsaturated group-having compound herein are mentioned below. Acrylates therefor include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers and the like.

Methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane and the like.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate and the like.

Crotonates include ethylene glycol dicrotonate, tetramethylene glycol dicrotonate, pentaerythritol dicrotonate, sorbitol tetra-dicrotonate and the like.

Isocrotonates include ethylene glycol diisocrotonate, pentaerythritol diisocrotonate, sorbitol tetraisocrotonate and the like.

Maleates include ethylene glycol dimaleate, triethylene glycol dimaleate, pentaerythritol dimaleate, sorbitol tetramaleate and the like.

Other esters also preferred for use herein are, for example, aliphatic alcohol esters such as those described in JP-B 46-27926 and 51-47334, and JP-A 57-196231; aromatic esters as in JP-A 59-5240, 59-5241, and 2-226149; amino-having esters as in JP-A 1-165613; and the like.

Mixtures of the ester monomers mentioned above may also be used herein.

Examples of amide monomers of aliphatic polyamines and unsaturated carboxylic acids that are usable herein are methylenebis-acrylamide, methylenebis-methacrylamide, 1,6-hexamethylenebis-acrylamide, 1,6-hexamethylenebis-methacrylamide, diethylenetriamine-trisacrylamide, xylylenebis-acrylamide, xylylenebis-methacrylamide and the like.

Other amide monomers also preferred for use herein are those having a cyclohexylene structure, as in JP-B 54-21726.

Also preferred are urethane polyadducts obtained through addition reaction of an isocyanate with a hydroxyl compound. Examples are vinylurethanes having at least two polymerizing vinyl groups in one molecule, which are produced through addition reaction of a polyisocyanate compound having at least two isocyanate groups in one molecule with a hydroxyl-having vinyl monomers of the following formula (2), in which R and R' each represent H or $CH_3$, as in JP-B 48-41708 and the like.

(2)

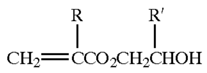

Also preferred for use herein are urethane acrylates such as those described in JP-A 51-37193, and JP-B 2-32293 and 2-16765; and ethylene oxide skeleton-having urethane compounds as in JP-B 58-49860, 56-17654, 62-39417, and 62-39418.

Also usable herein are addition-polymerizable compounds having an amino structure or sulfido structure in the molecule, such as those described in JP-A 63-277653, 63-260909, and 1-105238. These give good photosensitive compositions of very high sensitivity.

Other examples usable herein are polyfunctional acrylates and methacrylates such as polyester acrylates, and epoxy acrylates produced through reaction of an epoxy resin with a (meth)acrylic acid, for example, as in JP-A 48-64183, and JP-B 49-43191, 52-30490. Also usable are specific unsaturated compounds as in JP-B 46-43946, 1-40337, and 1-40336; and vinylphosphonic acids as in JP-A 2-25493. As the case may be, preferred are perfluoroalkyl-having compounds such as those described in JP-A 61-22048. Also usable herein are photo-curable monomers and oligomers disclosed in *Journal of the Adhesive Association of Japan*, Vol. 20, No. 7. pp. 300–308 (1984).

Details of the use of these addition-polymerizable compounds in the present invention, including what type of the compound is used, whether the compounds are used singly or combined, and how much of the compound is added to the photosensitive layer, may be determined in accordance with design requirements of the final photosensitive material of the present invention. For example, the compound may be selected from the following viewpoints. With respect to the sensitivity of the photosensitive material, preferred are addition-polymerizable compounds having more unsaturated groups in one molecule. In many cases, preferred are difunctional, or more polyfunctional, compounds. On the other hand, in order to increase the mechanical strength of the image area, that is, the mechanical strength of the cured film of the material, preferred are trifunctional, or more polyfunctional, compounds. Combining various addition-polymerizable compounds that differ in the number of functional groups therein and in the type of polymerizing groups therein (for example, acrylates, methacrylates, styrenes, vinyl ethers) for use herein will be effective for enhancing both the sensitivity of the photosensitive material and the mechanical strength of the image area of the film of the material. Compounds having a large molecular weight and compounds having a high degree of hydrophobicity will ensure high sensitivity and high film strength, but are often undesirable as they may not process well at high development speeds, and they often deposit in developers.

Selecting and using desired addition-polymerizable compounds in the present invention is a matter of great importance with regard to compatibility and dispersibility with other components of the composition of the photosensitive layer (e.g., binder polymers, polymerization initiators, and colorants). For example, using low-purity compounds or combining two or more different compounds may improve the compatibility of the compounds with the other components. As the case may be, compounds having a specific structure may be selected for improving the adhesiveness of the image-recording layer to a support and to an overcoat layer of the planographic printing plate precursor of the present invention. The support and the overcoat layer will be described hereinunder. In general, a blend ratio of the addition-polymerizable compound in the composition for the photosensitive layer (this composition will be hereinafter referred to as "photosensitive composition") is preferably larger, for higher sensitivity of the layer. However, if too large, there will be problems in that unfavorable phase separation may occur in the coating liquid for the layer, the layer will be sticky and will interfere with smooth production of the recording material (for example, components of the recording layer will transfer and adhere to unintended areas), and insoluble solids will deposit in a developer used for processing the planographic printing plate precursor. In view of this, the preferred blend ratio of the addition-polymerizable compound in the photosensitive composition of the present invention is from 5 to 80% by weight, more preferably from 20 to 75% by weight, relative to total components of the composition. One or more different types of addition-polymerizable compounds may be in the photosensitive composition, singly or combined. Regarding a method of using the addition-polymerizable compounds in the present invention, the structure, the blend ratio and the amount of the compounds in the photosensitive composition may be suitably selected depending on a degree of polymerization retardation of the compounds by oxygen, a resolution of the recording layer containing the compound, a fogging resistance thereof, a refractive index change thereof and surface adhesiveness thereof. As the case may be, overcoat layers or undercoat layers may be disposed on or below the recording layer in any desired manner.

(D) Binder

Preferably, the photosensitive layer in the planographic printing plate precursor of the present invention contains a binder polymer for improving film characteristics of the layer. For the binder, preferred are water-insoluble, alkaline aqueous solution-soluble linear organic polymers. The "linear organic polymers" used herein may be any of known ones. Preferred are those soluble or swellable in water or weak alkaline water, for enabling development of the plate precursor with water or weak alkaline water. A linear organic polymer serving as a film-forming agent in the photosensitive composition may be selectively used, depending on a mode of development of the material with one of water, weak alkaline water and solvent developers. For example, when a water-soluble organic polymer is used, the plate precursor can be developed with water. The linear organic polymer may be an addition polymer having a carboxylic acid group in side branches, such as those described in JP-A 59-44615, JP-B 54-34327, 58-12577 and 54-25957, and JP-A 54-92723, 59-53836 and 59-71048. These include, for example, methacrylic acid copolymers, acrylic acid copolymers, itaconic acid copolymers, crotonic acid copolymers, maleic acid copolymers, and semi-esters of maleic acid copolymers. In addition to these, also usable herein are acid cellulose derivatives having a carboxylic acid group in side branches, as well as hydroxyl-having polymer adducts with cyclic acid anhydrides.

Of these, especially preferred for use herein are copolymers of a benzyl (meth)acrylate, (meth)acrylic acid, and optionally another addition-polymerizable vinyl monomer; and copolymers of an allyl (meth)acrylate, (meth)acrylic acid, and optionally another addition-polymerizable vinyl monomer, because these ensure a good balance of film strength, sensitivity and developability.

Also preferred are urethane binder polymers having an acid group, such as those described in JP-B 7-120040, 7-120041, 7-120042, and 8-12424, JP-A 63-287944, 63-287947, and 1-271741, and Japanese Patent Application No. 10-116232, which ensure extremely high mechanical strength of the image-recording layer of the material, and therefore ensure good printing durability of the processed material and low-exposure latitude in processing the material.

Also preferred are amide-having binders such as those in JP-A 11-171907, which ensure both good developability and high film strength.

In addition, polyvinyl pyrrolidone and polyethylene oxide are also preferred for water-soluble linear organic polymers for use herein. Also preferred are alcohol-soluble nylons and polyethers of 2,2-bis(4-hydroxyphenyl)propane and epichlorohydrin, for increasing the mechanical strength of the cured film of the recording material. The linear organic polymer may be in the photosensitive composition in any desired blend ratio. However, if its blend ratio exceeds 90% by weight, it will not produce good results in point of mechanical strength of the images formed. Preferably, therefore, the blend ratio of the polymer in the composition is from 30 and 85% by weight. Also preferably, a blend ratio of the photo-polymerizable, ethylenically unsaturated double bond-having compound to the linear organic polymer in the composition is from 1/9 to 7/3 by weight.

The binder polymer used in the plate precursor of the present invention is substantially insoluble in water but soluble in an aqueous alkali solution. Therefore, the developer to be used for processing the plate precursor does not require an organic solvent which is unfavorable to the environment and, even if such is contained, the amount of the organic solvent in the developer may be extremely small. The acid value (this means the acid content of the polymer, represented in terms of a chemical equivalent per gram of the polymer) and the molecular weight of the binder polymer are appropriately determined, depending on the mechanical strength of the image to be formed in the processed plate and the developability of the plate precursor. Preferably, the acid value of the binder polymer is from 0.4 to 3.0 meq/g, and the molecular weight thereof is from 3,000 to 500,000; more preferably, the acid value is from 0.6 to 2.0 and the molecular weight is from 10,000 to 300,000.

(E) Other Components

The photosensitive composition of the present invention may appropriately contain other components, depending on uses and production methods. Preferred additives are mentioned below.

(E-1) Co-Sensitizer

One type of additive (hereinafter referred to as "co-sensitizer") is effective for further increasing the sensitivity of the composition. Although not clear, the function and the mechanism of the co-sensitizer are thought to be based on the following chemical process: Specifically, it is presumed that various active intermediate matters (radicals and cations), formed by an optical reaction initiated by the thermal polymerization initiator and followed by addition polymerization, will react with the co-sensitizer to form additional active radicals. The co-sensitizer includes three types: (a) a compound that is reduced to give an active radical; (b) a compound that is oxidized to give an active radical; and (c) a compound that reacts with a radical of low activity to thereby change the radical into a different type, of higher activity, or acts as a chain transfer agent. For this, however, a commonly accepted theory has not as yet been established as to how and in what manner the respective compounds should be classified into these types.

(a) Compound That is Reduced to Give Active Radical:

Carbon-Halogen Bond-Having Compound:

A compound of the type will be reductively degraded at the carbon-halogen bond to give an active radical. Concretely, compounds of this type include trihalomethyl-s-triazines, trihalomethyl-oxadiazoles and the like.

Nitrogen—Nitrogen Bond-Having Compound:

A compound of this type will be reductively degraded at the nitrogen—nitrogen bond to give an active radical. Concretely, hexaaryl-biimidazoles and the like are preferred.

Oxygen—Oxygen Bond-Having Compound:

A compound of this type will be reductively degraded at the oxygen—oxygen bond to give an active radical. Concretely, organic peroxides and the like are preferred.

Onium compound:

This will be reductively degraded at a carbon-hetero bond or oxygen-nitrogen bond therein to give an active radical. Concretely, diaryl iodonium salts, triarylsulfonium salts, N-alkoxypyridinium (azinium) salts and the like are preferred.

Ferrocene, Iron-Arene Complex:

Through reduction, these give an active radical.

(b) Compound That is Oxidized to Give Active Radical:

Alkylate Complex:

This will be reductively degraded at a carbon-hetero bond to give an active radical. Concretely, triarylalkyl borates and the like are preferred.

Alkylamine Compound:

This will be oxidatively degraded at a C—X bond on a carbon atom adjacent to a nitrogen atom therein to give an active radical. In this, X is preferably a hydrogen atom, a carboxyl group, a trimethylsilyl group or a benzyl group. Concretely, for example, this includes ethanolamines, N-phenylglycines, N-trimethylsilylmethylanilines and the like.

Sulfur or Tin-Containing Compound:

This is the same as the above-mentioned amine compound, in which, however, the nitrogen atom in the amine compound is substituted with a sulfur or tin atom. Similarly to the amine compound, this may be degraded to give an active radical. In addition, S—S bond-having compounds also act for sensitization through S—S cleavage therein.

α-Substituted Methylcarbonyl Compound:

Through oxidation, this may be degraded at a carbonyl-α-carbon bond therein to give an active radical. Derivatives thereof having an oxime ether structure in place of the carbonyl structure also act in the same manner. Concretely, for example, this includes kinds of 2-alkyl-1-[4-(alkylthio)phenyl]-2-morpholinoproline-1, and oxime ethers produced by reacting the same with hydroxyamines followed by etherifying them at N-OH.

Sulfinic Acid Salt:

Through reduction, this gives an active radical. Concretely, for example, it includes sodium arylsulfinates.

(c) Compound That Reacts with Radical to Give a Radical of Higher Activity, or Acts as Chain Transfer Agent:

For example, this includes compounds having any of SH, PH, SiH or GeH in the molecule. This reacts with a low-activity radical to give hydrogen thereto, and forms a radical of higher activity; or, after oxidation, this is deprotonated to give a radical. Concretely, for example, it includes 2-mercaptobenzimidazoles and the like.

Many concrete examples of the co-sensitizer are described in, for example, JP-A 9-236913, in which the co-sensitizer disclosed serves as an additive for improving the sensitivity of photosensitive materials. All of these may apply also to the present invention.

(E-2) Polymerization Inhibitor

Preferably, in the present invention, a small amount of a thermal polymerization inhibitor is added to the photosensitive composition in addition to the above-mentioned basic components, for preventing unnecessary thermal polymerization of the polymerizable ethylenically unsaturated bond-having compound in the composition while the composition is being produced or stored. Suitable examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), cerous N-nitrosophenylhydroxylamine and the like. Preferably, the amount of the thermal polymerization inhibitor in the composition is from about 0.01% by weight to about 5% by weight of the composition. If desired, a higher fatty acid or its derivative having the ability to prevent polymerization retardation by oxygen, such as behenic acid or a behenic acid amide, may be added to the composition. In the planographic printing plate precursor containing the composition, the acid or acid derivative added to the composition may, in the step of drying the support coated with the composition, be localized in a surface of the photosensitive layer of the composition formed on the support. Preferably, the amount of the higher fatty acid or its derivative in the photosensitive composition is from about 0.5% by weight and about 10% by weight of the composition.

(E-3) Colorant

For coloring the photosensitive layer, a dye or pigment may be added to the layer. The dye or pigment added to the layer improves the visibility of the processed plate and broadens plate inspection latitude in a process of measuring the image density of the processed layer. For the colorant to be in the layer, however, pigments are preferred, since many dyes often lower the sensitivity of a photo-polymerizable photosensitive layer. Concretely, for example, colorants usable herein include pigments such as phthalocyanine pigments, azo pigments, carbon black, titanium oxide and the like; and dyes such as ethyl violet, crystal violet, azo dyes, anthraquinone dyes, cyanine dyes and the like. Preferably, the amount of such dye or pigment to be in the photosensitive composition is from about 0.5% by weight to about 5% by weight of the composition.

(E-4) Other Additives

The photosensitive layer in the present invention may further contain, if desired, any known additives such as, for example, an inorganic filler for improving the physical properties of the cured film, a plasticizer, an oleophilicity improver for improving the ability of the image-formed layer of the printing plate to receive ink, and the like.

The plasticizer includes, for example, dioctyl phthalate, didodecyl phthalate, triethylene glycol dicaprylate, dimethylglycol phthalate, tricresyl phosphate, dioctyl adipate, dibutyl sebacate, triacetylglycerin and the like. In cases where the photosensitive composition contains a binder, the plasticizer content of the composition may be at most 10% by total weight of the ethylenically unsaturated double bond-having compound and the binder in the composition.

Also, as desired, the photosensitive composition may further contain a UV initiator and a thermal crosslinking agent for enhancing post-heating and post-exposure after development, that is, for improving film strength (printing durability) of the printing plate, which will be described hereinunder.

Further, as desired, the printing plate precursor of the present invention may further contain other additives and may have interlayers for improving adhesiveness between the photosensitive layer and the support and for improving removability of the non-exposed photosensitive layer in development. For example, any of diazonium compounds, phosphone compounds and others that interact relatively strongly with a support may be added to the photosensitive layer to be formed on the support, or the support may be undercoated with any of such compounds, whereby the adhesiveness of the photosensitive layer to the support is increased and the printing durability of the printing plate is enhanced. Also, a hydrophilic polymer of, for example, a polyacrylic acid or polysulfonic acid may be added to the photosensitive layer, or the support may be undercoated with such a hydrophilic polymer, whereby developability of a non-image area of the layer is enhanced and staining resistance of the printing plate is enhanced.

The planographic printing plate precursor of the present invention may have other optional layers, which will be described hereinunder.

Protective Layer

The planographic printing plate precursor of the present invention is generally exposed to light in air, and therefore it is desirable that the photopolymerizable composition layer of the plate precursor is protected with a protective layer that overlies it. The protective layer formed on the photosensitive layer in the plate precursor acts to prevent low-molecular compounds such as oxygen and basic substances from entering the photosensitive layer, and thereby facilitates exposure of the photosensitive layer to light in air (such low-molecular compounds are present in air and retard image formation in the photosensitive layer when it is exposed to light in air). Accordingly, the necessary characteristic of the protective layer is that oxygen and other low-molecular compounds permeate little through the layer. In addition, it is desirable that light transmission through the protective layer is high, the adhesiveness of the protective layer to the underlying photosensitive layer is good, and the protective layer is readily removed by development after the exposure to light.

Various such protective layers have heretofore been devised, for example, as described in detail in U.S. Pat. No. 3,458,311 and JP-A 55-49729. As a material for the protective layer, for example, preferred is a water-soluble polymer compound having a relatively high degree of crystallinity. Concretely known thereas are water-soluble polymers such as polyvinyl alcohol, polyvinyl pyrrolidone, acetic cellulose, gelatin, gum arabic, and polyacrylic acid. Of those, polyvinyl alcohol is preferred for the essential component of the protective layer, due to providing the best results for basic characteristics of a layer that blocks out oxygen and is readily removable in development. Polyvinyl alcohol for the protective layer may be partially esterified, etherified and/or acetallized, as long as it has unsubstituted vinyl alcohol units that are necessary for its oxygen barrier property and for its solubility in water. Also, as desired, a part thereof may have another copolymer component.

For example, polyvinyl alcohol hydrolyzed to a degree of from 71 to 100% and having a molecular weight of from 300 to 2,400 may be used for the protective layer. Examples of polyvinyl alcohols of this type are Kuraray's PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 and the like.

The constituent components of the protective layer (e.g., the type of PVA to be used, the presence or absence of additives in the layer), and the amounts forming the layer should be determined in consideration of the oxygen barrier property of the layer and the removability of the layer in development, and also fogging resistance, adhesiveness and scratch resistance of the layer. In general, it is desirable that PVA hydrolyzed to a higher degree (PVA of which the unsubstituted vinyl alcohol units content is higher) is used to form a thicker protective layer, as the oxygen barrier property of the layer is better and the sensitivity thereof is higher. However, if the ability of the protective layer to block out oxygen is enhanced too much, there are problems in that some unnecessary polymerization will occur in the photosensitive layer when the plate precursor comprising the layer is being produced or being stored before processing, and that, when imagewise exposed, the layer will be undesirably fogged or image lines formed by exposure will be thickened. Moreover, the adhesiveness of the protective layer to the image area of the processed photosensitive layer and the scratch resistance of the protective layer are also extremely important when handling the printing plate having the protective layer. Specifically, when a hydrophilic layer of a water-soluble polymer (that is, the protective layer of this case) is laminated over an oleophilic polymerizing layer (that is, the photosensitive layer), the hydrophilic polymer layer tends to peel off from the oleophilic polymerizing layer because adhesiveness between the two is low. If this happens, the part of the oleophilic polymerizing layer (photosensitive layer) from which the hydrophilic polymer layer (protective layer) has peeled cannot be polymerized well due to oxygen penetration thereinto, and this will therefore lead to a defect of curing failure.

To prevent this, that is, to improve the adhesiveness between the two layers, various proposals have heretofore been made. For example, from 20 to 60% by weight of an acrylic emulsion or a water-insoluble vinyl pyrrolidone-vinyl acetate copolymer is added to a hydrophilic polymer essentially of polyvinyl alcohol, and a layer of the resulting mixture is laminated over a polymerizing layer to ensure good adhesiveness between the two layers. Any known technique, such as that disclosed in these U.S. patent application specifications, may be applied to the protective layer in the present invention. Methods of forming the protective layer in such known manner are described in detail in, for example, U.S. Pat. No. 3,458,311 and JP-A 55-49729.

If desired, the protective layer may be modified to have additional functions. For example, a colorant (e.g., a water-soluble dye) capable of transmitting the light for exposure well and efficiently absorbing other light, which does not participate in image formation, may be added to the protective layer to further broaden the safe light latitude of the recording material having the protective layer without lowering the sensitivity of the photosensitive layer that underlies the protective layer. The protective layer having an oxygen transmittance of at least $1\times10^{-15}$ {$cm^2$(STP)·cm/$cm^2$·sec·cmHg}, as described in JP-A 2000-347398, is also favorable to the present invention.

Resin Interlayer In the planographic printing plate precursor of the present invention, a resin layer of an alkali-soluble polymer may be provided, if desired, between the recording layer containing the photopolymerizing compound and the support. In the printing plate precursor having the resin interlayer, the photopolymerizing compound-containing, IR-sensitive recording layer, whose solubility in an alkali developer reduces after exposure to IR rays, may be at or near a light-receiving face of the precursor, and thus the sensitivity of the recording layer to IR laser can be satisfactorily increased. In addition, in the printing plate precursor, the resin interlayer existing between the support and the IR-sensitive recording layer functions as a heat-insulating layer, and therefore the heat generated by exposure of the precursor to the IR laser is efficiently transferred to the recording layer without diffusing into the support, and, as a result, the sensitivity of the photosensitive layer is increased. In the exposed area of the printing plate precursor, the photosensitive layer, whose imperviousness to alkali developer has changed, functions as a protective layer for the resin interlayer, and thus development stability of the precursor is further enhanced. As a result, images of good discrimination can be formed on the processed printing plate and, in addition, storage stability of the processed printing plate may be enhanced. In the non-exposed area of the processed printing plate, the non-cured binder component rapidly dissolves and disperses in developer. Also, since the resin interlayer adjacent to the support comprises an alkali-soluble polymer substance, it dissolves well in the developer. Thus, for example, even if a developer of lowered activity is used for processing the printing plate precursor, the layer in the non-exposed area can rapidly dissolve therein, and not interfere with the developability of the precursor.

Support

The support of the planographic printing plate precursor of the present invention is not specifically limited, as long as it is a tabular sheet of dimensional stability. For example, it may include paper; paper laminated with a plastic material (e.g., polyethylene, polypropylene, or polystyrene); metal sheets (of, for example, aluminium, zinc or copper); and plastic films (of, for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal). The support may be a sheet of a single component such as a resin film or metal sheet, or may be a laminate of two or more components. The latter includes, for example, paper or plastic films coated with metal as above through lamination or deposition; and laminated sheets of different types of plastic films.

For the support, preferred are polyester films or aluminium sheets. Above all, especially preferred are aluminium sheets, which have good dimensional stability and are relatively inexpensive. Preferably, the aluminium sheets for use herein are of pure aluminium or an aluminium alloy consisting essentially of aluminium and containing traces of hetero elements. Aluminium-laminated or deposited plastic films are also usable herein. The hetero elements in the aluminium alloy include, for example, silicon, iron, manganese, copper, magnesium, chromium, zinc, bismuth, nickel and titanium. The hetero element content of the aluminium alloy is at most 10% by weight. Especially preferred for use in the present invention are pure aluminium sheets. However, completely pure aluminium is difficult to prepare in an ordinary smelting technique. Therefore, the aluminium for use herein may contain small amounts of hetero elements. Aluminium sheets for use in the present invention are not specifically defined with regard to composition, and known aluminium sheets which have heretofore been used in the art may be used in the present invention.

The thickness of an aluminium sheet for use herein may be from 0.1 mm to 0.6 mm or so, preferably from 0.15 mm to 0.4 mm, and more preferably from 0.2 mm to 0.3 mm.

Prior to roughening, if desired, the surface of the aluminium sheet for use in the present invention may be degreased, for example, by treatment with a surfactant, an organic solvent or an aqueous alkali solution for removing rolling oil. The surface of the aluminium sheet may be roughened by various methods. For example, it may be mechanically roughened, or may be roughened through electrochemical surface dissolution or through selective chemical dissolution. For mechanical roughening, any known method is employable. For example, the surface of the aluminium sheet may be roughened in a mode of ball grinding, brushing, blasting, or buffing. For electrochemical roughening, for example, the aluminium sheet may be processed in an electrolytic solution of hydrochloric acid or nitric acid with a direct current or an alternating current being applied thereto. The two methods may be combined, if desired, as in JP-A 54-63902.

If desired, the thus-roughened aluminium sheet may be etched with alkali and neutralized, and then optionally subjected to anodic oxidation for further enhancing water retentiveness and abrasion resistance of its surface. For anodic oxidation of the aluminium sheet, employable are various types of electrolytes capable of forming porous oxide films. Generally employed herein is sulfuric acid, phosphoric acid, oxalic acid, chromic acid or a mixture thereof. The concentration of the electrolyte for anoxic oxidation may be determined based on the type of electrolyte used.

The conditions for anodic oxidation vary depending on the type of electrolyte used, and therefore cannot be specified for all cases. In general, however, the electrolyte concentration of the processing solution may suitably be from 1 to 80% by weight; the temperature of the processing solution may be from 5 to 70° C.; the current density may be from 5 to 60 A/$dm^2$; the voltage may be from 1 to 100 V; and the time for electrolysis may be from 10 seconds to 5 minutes.

The amount of the oxide film to be formed through such anodic oxidation is preferably at least 1.0 g/$m^2$, and more preferably from 2.0 to 6.0 g/$m^2$. If the amount of the oxide film formed is smaller than 1.0 g/$m^2$, this will be unsatisfactory for desired printing durability, and the non-image area of the planographic printing plate will be readily scratched. If the plate is scratched, ink will adhere to the scratched part of the printing plate and the prints obtained will tend to be stained.

The support for the planographic printing plate is subjected to anodic oxidation on the surface that is to be used for printing. In general, however, the back surface of the support is also subjected to anodic oxidation to some degree, forming an oxide film of from 0.01 to 3 g/$m^2$ thereon, owing to cycling of electric force lines in the process of anodic oxidation.

After having been subjected to anodic oxidation in the above manner, the surface of the support is optionally hydrophilicated, for which any known method is employable. For the hydrophilication, for example, herein employable is a method of processing the support with an alkali metal silicate (e.g., aqueous sodium silicate solution), as in U.S. Pat. Nos. 2,714,066, 3,181,461, 3,280,734 and 3,902, 734. In this method, the support is dipped in an aqueous sodium silicate solution or is electrolyzed in such solution. Besides this, also employable is a method of processing the support with potassium fluorozirconate, as in JP-B 36-22063; or a method of processing it with polyvinylphosphonic acid, as in U.S. Pat. Nos. 3,276,868, 4,153,461 and 4,689,272.

If desired, the back surface of the support may be coated with a back-coat layer. For the back-coat layer, preferred are organic polymer compounds such as those described in JP-A 5-45885; and metal oxides formed by hydrolyzing and polycondensing organic or inorganic metal compounds such as those described in JP-A 6-35174.

Of these, more preferred for the back-coat layer are silicon alkoxides such as $Si(OCH_3)_4$, $Si(OC_2H_5)_4$, $Si(OC_3H_7)_4$, and $Si(OC_4H_9)_4$, which are inexpensive and easily available. Especially preferred are coat layers of such metal oxides, which are highly resistant to developers.

Exposure:

The planographic printing plate precursor of the present invention can be fabricated in the above manner. Thus fabricated, the precursor is then imagewise exposed to a solid laser or a semiconductor laser that emits IR rays within a wavelength range of from 760 nm to 1200 nm. Scanning exposure for image formation may be effected with any known device. Exposure devices usable here may be any of inner drum exposure units, outer drum exposure units and flat head exposure units.

The advantage of the planographic printing plate precursor of the present invention, which includes a combination of a specific polymerization initiator of high sensitivity and a polymerization inhibitor, is that an area not desired to be exposed by light of low energy is protected from being polymerized. Therefore, the plate precursor of the present invention can be favorably processed even in an exposure process in which a light extinction ratio is low. The advantage of the plate precursor of the present invention is particularly remarkable when it is processed in an exposure process of this type.

The planographic printing plate precursor of the present invention may be directly developed immediately after exposure to the laser. Preferably, however, the plate is heated between a step of laser exposure and a step of development. Regarding conditions of heat treatment, the plate precursor is, after exposure to light, heated at a temperature of from 80° C. to 150° C. for a period of time from 10 seconds to 5 minutes. This heat treatment reduces the necessary laser energy in the step of laser exposure.

Development:

In general, the planographic printing plate precursor of the present invention is, after having been imagewise exposed to IR laser in the above manner, preferably developed with water or an aqueous alkali solution.

The developer for the exposed precursor of the present invention is preferably an aqueous alkaline solution. More preferably, the aqueous alkaline solution serving as the developer has a pH of from 10.5 to 12.5, even more preferably from 11.0 to 12.5. If the pH of the aqueous alkaline solution used for the developer is smaller than 10.5, the non-image area of the developed plate will be stained, and if larger than 12.5, the mechanical strength of the image area of the developed plate will be lower.

In cases where the printing plate precursor of the present invention is, after exposure, developed with such aqueous alkaline solution, the developer, and a replenisher for the developer, may be any of known aqueous alkaline solutions. For these, for example, usable are inorganic alkali salts such as sodium and potassium silicates, sodium, potassium and ammonium tertiary phosphates, sodium, potassium and ammonium secondary phosphates, sodium, potassium and ammonium carbonates, sodium, potassium and ammonium hydrogencarbonates, sodium, potassium and ammonium borates, sodium, ammonium, potassium and lithium hydroxides, and the like. Also usable are organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and the like.

These alkalis may be used singly or in a combination of two or more.

When an automatic processor is used, it is known that a replenisher, which is the same as the developer originally in a development tank or is an aqueous solution having a higher alkali concentration than the original developer, can replenish the development tank. In a processor of this system, a large number of planographic printing plate precursors can be continuously processed even if the developer in the development tank is not exchanged for a long period of time. This replenishing system is favorable to the present invention.

If desired, various surfactants and organic solvents may be added to the developer and the replenisher, for promoting or retarding development, for dispersing developer wastes, and for enhancing affinity of the image area of the developed printing plate to ink.

Preferably, the developer contains from 1 to 20% by weight of a surfactant, more preferably from 3 to 10% by weight. If the surfactant content of the developer is smaller than 1% by weight, developability with the developer will not be satisfactorily enhanced; and a content larger than 20% by weight is unfavorable because abrasion resistance and mechanical strength of the image area of the developed printing plate will be lower.

For the surfactant, preferred are anionic, cationic, nonionic or ampholytic surfactants. Concretely, they include sodium lauryl alcohol sulfate, ammonium lauryl alcohol sulfate, sodium octyl alcohol sulfate; alkylarylsulfonates such as sodium isopropylnaphthalenesulfonate, sodium isobutylnaphthalenesulfonate, sodium polyoxyethylene glycol mononaphthylethyl sulfate, sodium dodecylbenzenesulfonate, sodium metanitrobenzenesulfonate; higher alcohol sulfates having from 8 to 22 carbon atoms, such as secondary sodium alkylsulfates; salts of aliphatic alcohol phosphates such as sodium cetyl alcohol phosphate; alkylamide sulfonates such as $C_{17}H_{33}CON(CH_3)CH_2CH_2SO_3Na$; dibasic aliphatic ester sulfonates such as dioctyl sodiumsulfosuccinate and dihexyl sodiumsulfosuccinate; ammonium salts such as lauryltrimethylammonium chloride and lauryltrimethylammonium mesosulfate; amine salts such as stearamidoethyldiethylamine acetate; polyalcohol esters such as monoesters of fatty acids with glycerol, and monoesters of fatty acids with pentaerythritol; and polyethylene glycol ethyls such as polyethylene glycol mononaphthyl ethyl, and polyethylene glycol mono (nonylphenol) ethyl.

Preferably, the organic solvent that may be in the developer or replenisher has a solubility in water of at most about 10% by weight, more preferably at most 5% by weight. Examples include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. Preferably, the organic solvent in the developer accounts for from 1 to 5% by weight of the developer in actual use. The organic solvent content of the developer is closely correlated to the surfactant content thereof. Preferably, with an increase in the organic solvent content of the developer, the surfactant content also increases. This is because, if the amount of the organic solvent in the developer is increases while that of the surfactant is small, the organic solvent will not dissolve well in the developer, and the developer will not exhibit good developability.

Also, as desired, other additives such as a defoaming agent and a water softener may be added to the developer and the replenisher. The water softener includes, for example, polyphosphates such as $Na_2P_2O_7$, $Na_5P_3O_3$, $Na_3P_3O_9$, $Na_2O_4P(NaO_3P)PO_3Na_2$, Calgon (sodium polymetaphosphate); aminopolycarboxylic acids and their salts, such as ethylenediamine-tetraacetic acid and its potassium and sodium salts, diethylenetriamine-pentaacetic acid and its potassium and sodium salts, triethylenetetramine-hexaacetic acid and its potassium and sodium salts, hydroxyethylethylenediamine-triacetic acid and its potassium and sodium salts, nitrilotriacetic acid and its potassium and sodium salts, 1,2-diaminocyclohexane-tetraacetic acid and its potassium and sodium salts, and 1,3-diamino-2-propanol-tetraacetic acid and its potassium and sodium salts; and organic phosphonic acids and their salts, such as 2-phosphonobutane-tricarboxylic acid-1,2,4 and its potassium and sodium salts, 2-phosphonobutane-tricarboxylic acid-2,3,4 and its potassium and sodium salts, 1-phosphonoethane-tricarboxylic acid-1,2,2 and its potassium and sodium salts, 1-hydroxyethane-1,1-diphosphonic acid and its potassium and sodium salts, aminotri (methylenephosphonic acid) and its potassium and sodium salts. The optimum amount of the water softener in the developer varies, depending on hardness of the water used and on the amount thereof in the developer. In general, the amount of the water softener in the developer in actual use may be from 0.01 to 5% by weight, preferably from 0.01 to 0.5% by weight.

In cases where the planographic printing plate precursor of the present invention is processed in an automatic processor, the developer used is fatigued in accordance with the amount of plate precursors processed. In such a case, a replenisher or a fresh developer may replenish the processor to thereby reactivate the developer in the processor. For this, preferably employed is the system described in U.S. Pat. No. 4,882,246.

Developers containing a surfactant, an organic solvent and a reducing agent such as those mentioned above are known. For example, JP-A 51-77401 discloses a developer comprising benzyl alcohol, an anionic surfactant, an alkali agent and water; JP-A 53-44202 discloses an aqueous developer containing benzyl alcohol, an anionic surfactant and a water-soluble sulfite; and JP-A 55-155355 discloses a developer containing an organic solvent, of which the solubility in water at room temperature is at most 10% by weight, an alkali agent and water. These are all favorable to the present invention.

After having been processed with a developer and replenisher such as those mentioned above, the printing plate is post-processed with washing water, a rinsing solution that contains a surfactant, or a fat-desensitizing solution that contains gum arabic or a starch derivative. For post-treating the printing plate precursor of the present invention that has been processed for image formation thereon, any of these solutions may be combined in any desired manner.

In the recent art of plate-making and printing, automatic processors for printing plates are widely used for rationalizing and standardizing the plate-making operation. In general, the automatic processor is composed of a developing section and a post-processing section, and is provided with a unit for conveying printing plate precursors to be processed therein, and processing solution tanks which are each equipped with a spraying unit. Each exposed plate is conveyed horizontally, and sprayed in sequence with processing solutions that are pumped to spray nozzles, and is thus developed and processed. Alternatively, a different system is known, in which each exposed plate precursor is led in order into tanks filled with processing solutions, and guided therein by guide rolls, and is thus developed and processed. In such automatic processors, replenishers may replenish the processing solutions in accordance with processing speed and processing time. As the case may be, this replenishment may be automated by monitoring the electroconductivity of each processing solution with a sensor.

A processing system with no replenishment is also employable, in which disposable processing solutions are used. In this, the printing plate precursors are processed with substantially unused processing solutions with no replenishers supplied thereto.

The planographic printing plates produced in the above manner are optionally coated with a fat-desensitizing gum, and are then used for producing prints. For further enhancing their printing durability, they may be subjected to a burning treatment.

Prior to burning, it is desirable that the planographic printing plates are treated with a surface-dressing solution as in, for example, JP-B 61-2518 and 55-28062, and JP-A 62-31859 and 61-159655.

For this, for example, the planographic printing plates may be wiped with sponge or absorbent cotton that contains a surface-dressing solution; or they may be dipped in a surface-dressing solution in a vat; or a surface-dressing solution may be applied thereto with an automatic coater. After having been thus coated with a surface-dressing solution, the plates are preferably squeezed with a squeegee or a squeezing roller so that they can be uniformly coated. This treatment produces better results.

The amount of the surface-dressing solution to be applied to the plates is generally from 0.03 to 0.8 $g/m^2$ (dry weight).

The planographic printing plates having been thus coated with the surface-dressing agent are, after optionally being dried, heated at a high temperature in a burning processor (for example, BURNING PROCESSOR model BP-1300 (trade name), manufactured by Fuji Photo Film Co., Ltd.). The heating temperature and heating time in this treatment vary depending on the image-forming components in the plates. In general, it is desirable that the plates are heated at a temperature of from 180 to 300° C., for 1 to 20 minutes.

After such burning, the planographic printing plates are optionally washed with water and gummed in any conventional manner. In cases where they are treated with a surface-dressing solution that contains a water-soluble polymer compound before burning, this fat-desensitization treatment, for example, gumming, may be omitted.

The planographic printing plate thus produced by the above process is set in an offset printer to give a large number of prints.

EXAMPLES

The present invention is now described in detail by reference to the following Examples, which, however, are not intended to restrict the scope of the present invention.

Examples 1 to 10

Preparation of Supports:

An aluminium sheet (#1050) having a thickness of 0.3 mm was degreased by washing it with trichloroethylene, and then its surface was sand-grained and etched with an aqueous pumice suspension, using a nylon brush. The sheet was washed with water, then dipped in 20% nitric acid, and again washed with water. A degree of surface etching of the sand-grained surface of the sheet was about 3 g/m$^2$.

Next, the sheet was electrolytically processed with an electrolyte, 7% sulfuric acid, while applying a direct current having a current density of 15 A/dm$^2$ thereto, to form an oxide film (3 g/m$^2$) on the surface. After being thus processed, the sheet was washed with water and dried. This is referred to as a support (A).

The support (A) was further processed with an aqueous 2 wt. % sodium silicate solution at 25° C. for 15 seconds, and then washed with water. This is referred to as a support (B).

Formation of Interlayer:

A liquid composition (sol) was prepared according to an SG process mentioned below.

The sol composition was as follows:

| | |
|---|---|
| Methanol | 130 g |
| Water | 20 g |
| 85 wt. % phosphoric acid | 16 g |
| Tetraethoxysilane | 50 g |
| 3-Methacryloxypropyltrimethoxysilane | 60 g |

These compounds were mixed and stirred. After about 5 minutes, heat generation was observed. The mixture was reacted for 60 minutes in this condition, and then transferred into a separate chamber. 3000 g of methanol was added thereto to prepare a sol liquid.

The sol liquid was diluted with methanol/ethylene glycol (9/1 by weight), and applied onto the substrate (A) in a manner controlled such that the amount of Si on the substrate could be 3 mg/m$^2$. Then, this was heated at 100° C. for 1 minute. This is referred to as a substrate (C).

Formation of Photosensitive Layer:

Photosensitive layer coating liquids having the composition mentioned below were applied onto the substrates (A) to (C) prepared in the above manner, and dried at 115° C. for 1 minute to thereby form a photosensitive layer (1.4 g/m$^2$) on each substrate. In this manner, planographic printing plate precursors of Examples 1 to 10 were fabricated. For these, the substrate used, the light-to-heat conversion agent (A), the polymerizable unsaturated group-having compound (B), the polyvalent anionic structure-having onium salt (C) (shown as "polymerization initiator" in Table 1), and the binder (D) were as indicated in Table 1 below.

The composition of the photosensitive layer coating liquid was as follows:

| | |
|---|---|
| (B) polymerizable compound (see Table 1) | 1.5 g |
| (D) Binder (see Table 1) | 2.0 g |
| (A) Light-to-heat conversion agent (see Table 1) | 0.1 g |
| (C) Polyvalent anionic onium salt (see Table 1) | 0.15 g |
| Fluorine-containing nonionic surfactant (Dai-Nippon Ink Chemical Industry: MEGAFAC F-177P ™) | 0.02 g |
| Dye derived from Victoria Pure Blue BOH by substituting counter anion with 1-naphthalenesulfonate anion | 0.04 g |
| Methyl ethyl ketone | 10 g |
| Methanol | 7 g |
| 2-Methoxy-1-propanol | 10 g |

DX-1

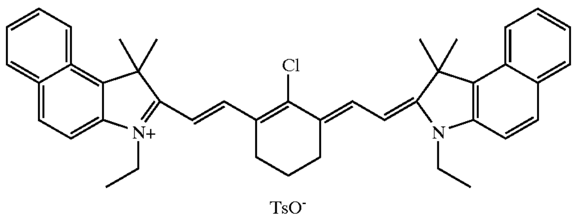

DX-2

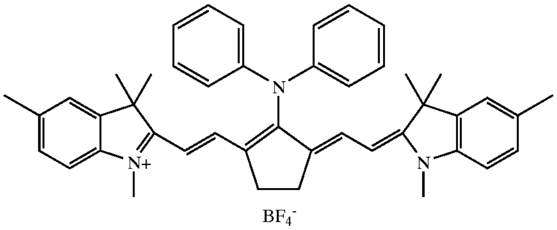

DX-3

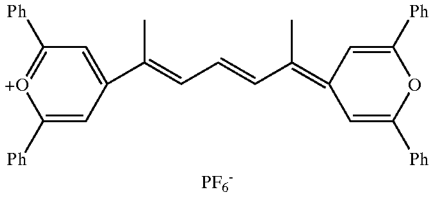

TABLE 1

| | Substrate | Polymerization Initiator | Light-to-heat conversion Agent | Polymerizable Compound | Binder | Developer | Sensitivity (mJ/cm$^2$) |
|---|---|---|---|---|---|---|---|
| Example 1 | A | SA-1 | DX-2 | M-1 | B-1 | DP-4 | 75 |
| Example 2 | B | SB-3 | DX-1 | M-2 | B-2 | DN-3C | 75 |
| Example 3 | C | SC-S | DX-2 | M-2 | B-1 | D-1 | 80 |
| Example 4 | A | SA-3 | DX-1 | M-1 | B-1 | D-1 | 70 |

TABLE 1-continued

| | Substrate | Polymerization Initiator | Light-to-heat conversion Agent | Polymerizable Compound | Binder | Developer | Sensitivity ($mJ/cm^2$) |
|---|---|---|---|---|---|---|---|
| Example 5 | B | SD-S | DX-3 | M-2 | B-3 | DP-4 | 80 |
| Example 6 | C | SG-2 | DX-1 | M-2 | B-1 | DP-4 | 80 |
| Example 7 | A | IA-A | DX-2 | M-1 | B-1 | DN-3C | 75 |
| Example 8 | B | IB-14 | DX-1 | M-1 | B-2 | D-1 | 80 |
| Example 9 | C | IC-2 | DX-2 | M-2 | B-2 | DP-4 | 75 |
| Example 10 | B | IH-4/ 10-1/ IA-1 | DX-2 | M-2 | B-2 | DN-3C | 75 |
| Comp. Ex. 1 | A | HS | DX-2 | M-1 | B-1 | DP-4 | 90 |
| Comp. Ex. 2 | B | HI | DX-3 | M-1 | B-2 | D-1 | 90 |

| | Sensitivity ($mJ/cm^2$) |
|---|---|
| Example 11 | 60 |
| Example 12 | 70 |
| Example 13 | 70 |
| Example 14 | 65 |
| Example 15 | 70 |
| Example 16 | 70 |
| Example 17 | 65 |
| Example 18 | 70 |
| Example 19 | 65 |
| Example 20 | 70 |
| Comp. Ex. 3 | 80 |
| Comp. Ex.4 | 85 |

M. B. Example and Example 20: blend ratio by weight of polymerization initiators IH-4/IC-1/IA-1 = /1/1/1.

In Table 1, the polymerizable compounds are as follows:

(M-1): pentaerythritol tetraacrylate.

(M-2): glycerin dimethacrylate/hexamethylene diisocyanate urethane prepolymer.

In Table 1, the binders are as follows:

(B-1): allyl methacrylate/methacrylic acid/N-isopropylamide copolymer (copolymerization ratio: 67/13/20 by mol), having an acid value (measured by titration with NaOH) of 1.15 meq/g, and a weight-average molecular weight of 130,000.

(B-2): allyl methacrylate/methacrylic acid copolymer (copolymerization ratio: 83/17 by mol), having an acid value (measured by titration with NaOH) of 1.55 meq/g, and a weight-average molecular weight of 125,000.

(B-3): polyurethane resin, condensate of the following diisocyanates and diols, (a) 4,4'-diphenylmethane diisocyanate, (b) hexamethylene diisocyanate, (c) polypropylene glycol (weight-average molecular weight: 1000), (d) 2,2-bis(hydroxymethyl)propionic acid, (copolymerization ratio of (a)/(b)/(c)/(d)=40/10/15/35 by mol), having an acid value (measured by titration with NaOH) of 1.05 meq/g, and a weight-average molecular weight of 45,000.

Comparative Examples 1 and 2

For comparison, comparative planographic printing plate precursors (Comparative Examples 1 and 2) were fabricated in the same manner as above, except that the coating composition used for the photosensitive layer differed from the above-mentioned photosensitive layer coating liquid of Examples 1 to 10 in that an onium salt (polymerization initiator, HS or HI) having as the counter anion therein a monovalent anionic structure and represented by the chemical formula mentioned below was used in place of the polyvalent anionic onium salt (polymerization initiator) (C) used in Examples 1 to 10.

HS

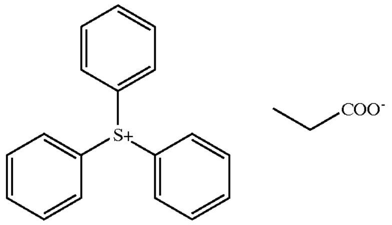

HI

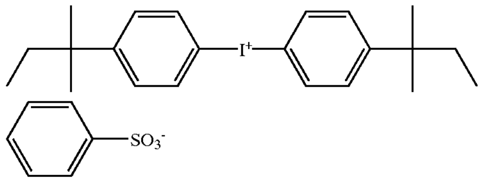

Exposure and Development:

The planographic printing plate precursors thus fabricated in the above manner were exposed to light, using a semiconductor laser having a power of 500 mW and emitting 830 nm light. The beam diameter of the laser was 17 μm ($1/e^2$), and its main-scanning speed was 5 m/sec. After being thus exposed, these were processed in an automatic processor (PS Processor 900 VR™, manufactured by Fuji Photo Film Co., Ltd.) supplied with any of DN3C™ (developer, manufactured by Fuji Photo Film Co., Ltd.), DP-4™ (developer, manufactured by Fuji Photo Film Co., Ltd.), or a developer D-1 having a composition described below, and with FR-3™ (rinse, manufactured by Fuji Photo Film Co., Ltd., diluted with water in a ratio of 1/7), and the sensitivity of each sample was evaluated in the manner described below. The type of developer used for each sample is indicated in Table 1 above.

The composition of the developer D-1 was as follows:

| | |
|---|---|
| Potassium hydroxide | 3 g |
| Sodium hydrogencarbonate | 1 g |
| Potassium carbonate | 2 g |
| Sodium sulfite | 1 g |

-continued

| | |
|---|---|
| Polyethylene glycol mononaphthyl ether | 150 g |
| Sodium dibutylnaphthalenesulfonate | 50 g |
| Tetrasodium ethylenediaminetetraacetate | 8 g |
| Water | 785 g |

Evaluation of Planographic Printing Plate Precursors

Sensitivity Evaluation:

Immediately after fabrication, the planographic printing plate precursors were exposed to IR rays of from 830 to 850 nm or so, using a semiconductor laser. After being thus exposed, they were developed with any of DN3C™ (developer, manufactured by Fuji Photo Film Co., Ltd., diluted with water in a ratio of 1/2), DP-4™ (developer, manufactured by Fuji Photo Film Co., Ltd., diluted with water in a ratio of 1/8), or the developer D-1 (diluted with water in a ratio of 1/5), and then rinsed with water. Based on line width of an image formed on each sample, laser output power, loss in an optical system and laser scanning speed, the quantity of energy needed for image formation on each sample was calculated. The smaller values indicate higher sensitivity of the samples tested.

The results are given in Table 1.

As shown in Table 1, it can be seen that the sensitivity of the planographic printing plate precursors of the present invention was high. On the other hand, it can also be seen that, compared with those of the present invention, the sensitivity of the planographic printing plate precursors of Comparative Examples 1 and 2 in which the onium salt used for the polymerization initiator did not have a polyvalent anionic structure was inferior.

Examples 11 to 20, Comparative Examples 3 and 4

Onto the photosensitive layer in each of the planographic printing plate precursors of Examples 1 to 10 and Comparative Examples 1 and 2 was applied an aqueous 3 wt. % solution of polyvinyl alcohol (having a degree of saponification of 98 mol %, and a degree of polymerization of 550) in a manner controlled such that the dry weight of a layer thereof would be 2 $g/m^2$. The precursors were then dried at 100° C. for 1 minute to form a protective layer on the photosensitive layer of each precursor. Thus fabricated, these were planographic printing plate precursors of Examples 11 to 20, and Comparative Examples 3 and 4.

Under the same conditions as in Examples 1 to 10, these planographic printing plate precursors were exposed to light and developed, and the resulting planographic printing plates were tested for their sensitivity and printing durability. The results are given in Table 1.

As shown in Table 1, the same results as in Examples 1 to 10 and Comparative Examples 1 and 2, which did not have a protective layer, were obtained. Concretely, the sensitivity of the planographic printing plate precursors of the present invention was high, and the protective layer formed thereon improved their properties. However, the planographic printing plate precursors of Comparative Examples 3 and 4, in which the onium salt used for the polymerization initiator did not have a polyvalent anionic structure, were still inferior to those of the Examples of the present invention with regard to sensitivity.

Examples 21 and 22

Formation of Resin Interlayer:

Using a wire bar, the substrate (A) was coated with a resin interlayer coating liquid described below in a manner controlled such that the dry weight of a formed layer would be 0.6 $g/m^2$, and then dried in a hot air drier at 120° C. for 45 seconds to form a resin interlayer thereon. Also using a wire bar, a second photosensitive layer coating liquid, described below, was applied onto the resin interlayer in a manner controlled such that the combined weight of the photosensitive layer and the resin interlayer could be 1.3 $g/m^2$, and then dried in a hot air drier at 120° C. for 50 seconds to thereby form a photosensitive layer on the resin interlayer. Thus fabricated, this was a planographic printing plate precursor of Example 21. In another case, the photosensitive layer of this plate precursor was coated with an aqueous solution of 3 wt. % polyvinyl alcohol (having a degree of saponification of 98 mol % and a degree of polymerization of 550) in a manner controlled such that the dry weight of a formed layer would be 2 $g/m^2$, and then dried at 100° C. for 1 minute to thereby form a protective layer on the photosensitive layer. Thus fabricated, this was a planographic printing plate precursor of Example 22.

The composition of the resin interlayer coating liquid was as follows:

| | |
|---|---|
| Binder (BN-1), copolymer of N-(p-aminosulfonylphenyl)methacrylamide and butyl acrylate (35/65 by mol) having a weight-average molecular weight of 60,000 | 2.0 g |
| Fluorine-containing nonionic surfactant (Dai-Nippon Ink Chemical Industry: MEGAFAC F-177P ™) | 0.02 g |
| Victoria Pure Blue naphthalenesulfonate | 0.04 g |
| Methyl ethyl ketone | 10 g |
| Methanol | 7 g |
| γ-butyrolactone | 10 g |

The composition of the second photosensitive layer coating liquid was as follows:

| | |
|---|---|
| (B) Polymerizable compound [M-1] | 1.5 g |
| (D) Binder [B-1] | 2.0 g |
| (A) Light-to-heat conversion agent [DX-1] | 0.1 g |
| (C) Polyvalent anionic onium salt [SA-3] | 0.15 g |
| Fluorine-containing surfactant (Dai-Nippon Ink Chemical Industry: MEGAFAC F-177P ™) | 0.02 g |
| Victoria Pure Blue naphthalenesulfonate | 0.04 g |
| Methyl ethyl ketone | 20 g |
| Methanol | 2 g |
| 2-Methoxy-1-propanol | 10 g |

Sensitivity Evaluation:

Immediately after fabrication, the planographic printing plate precursors of Examples 21 and 22 were exposed to IR rays of from 830 to 850 nm or so, using a semiconductor laser. After being thus exposed, they were developed with the developer D-1 (diluted with water in a ratio of 1/5), and then rinsed with water. Based on the line width of the image formed on each sample, the laser output power, the loss in the optical system and the laser scanning speed, the quantity of energy needed for image formation on each sample was calculated. Consequently, the sensitivity of the precursor of Example 21 was 75 $mJ/cm^2$, and that of the precursor of Example 22 was 70 $mJ/cm^2$, in terms of the quantity of energy needed for image formation. Thus, it can be seen that the sensitivity of the precursors of these Examples was high. This means that the planographic printing plate precursor of the present invention, even when having a multi-layered structure containing a resin interlayer, still has high sensitivity.

As described in detail hereinabove with reference to its preferred embodiments, the negative planographic printing plate precursor of the present invention can be imagewise exposed to IR rays from an IR-emitting solid laser or semiconductor laser and ensures direct image formation thereon from digital data of a computer or the like, and excellent image-recording sensitivity is achieved.

What is claimed is:

1. A negative planographic printing plate precursor for a heat-mode exposure system, the plate precursor comprising, on a support, a photosensitive layer that is exposable with an IR laser, the photosensitive layer including:

(A) a light-to-heat conversion agent;

(B) a polymerizable unsaturated group-having compound; and (C) a polyvalent anionic onium salt having a counter anion that has a valency of at least two.

2. The negative planographic printing plate precursor of claim 1, wherein the counter anion of the polyvalent anionic onium salt (C) comprises an anionic structure whose valency is from two to six.

3. The negative planographic printing plate precursor of claim 1, wherein the polyvalent anionic onium salt (C) comprises a cation site selected from the group consisting of cation sites of sulfonium salts, iodonium salts, diazonium salts, azinium salts and ammonium salts.

4. The negative planographic printing plate precursor of claim 1, wherein the polyvalent anionic onium salt (C) comprises a salt selected from the group consisting of iodonium salts represented by the following general formula (1), diazonium salts represented by the following general formula (2), and sulfonium salts represented by the following general formula (3):

$$Ar^{11}—I^{+}—Ar^{12}Z^{11-} \quad (1)$$

$$Ar^{21}—N^{+}{\equiv}N\ Z^{21-} \quad (2)$$

(3)

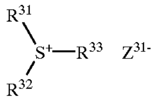

wherein $Ar^{11}$, $Ar^{12}$ and $Ar^{21}$ each independently represent an optionally substituted aryl group having at most 20 carbon atoms; $R^{31}$, $R^{32}$ and $R^{33}$ may be the same or different, each representing an optionally substituted hydrocarbon group having at most 20 carbon atoms; and $Z^{11-}$, $Z^{21-}$ and $Z^{31-}$ each independently represent the counter anion having a valency of at least two.

5. The negative planographic printing plate precursor of claim 1, wherein the polyvalent anionic onium salt (C) is selected from the group consisting of triarylsulfonium salts and diaryliodonium salts.

6. The negative planographic printing plate precursor of claim 1, wherein the polyvalent anionic onium salt (C) comprises an anion site which includes at least one conjugated base selected from the group consisting of conjugated bases of carboxylic acid, sulfonic acid, phosphonic acid, phenols and $R^1—SO_2—NH—R^2$, $R^1$ and $R^2$ each representing a monovalent, non-metallic organic group.

7. The negative planographic printing plate precursor of claim 1, wherein the polyvalent anionic onium salt (C) comprises an anion site which is one of a conjugated base of carboxylic acid and a conjugated base of sulfonic acid.

8. The negative planographic printing plate precursor of claim 1, wherein the polyvalent anionic onium salt (C) comprises an anion site which is a conjugated base of oxalic acid.

9. The negative planographic printing plate precursor of claim 1, wherein the polyvalent anionic onium salt (C) comprises a maximum absorption wavelength which is not longer than 400 nm.

10. The negative planographic printing plate precursor of claim 1, wherein the polyvalent anionic onium salt (C) comprises a maximum absorption wavelength which is not longer than 360 nm.

11. The negative planographic printing plate precursor of claim 1, wherein the light-to-heat conversion agent (A) comprises an IR-absorbing dye or pigment, the IR-absorbing dye or pigment having a maximum absorption wavelength from 760 nm to 1200 nm.

12. The negative planographic printing plate precursor of claim 1, wherein the light-to-heat conversion agent (A) comprises a material selected from the group consisting of cyanine colorants, phthalocyanine dyes, oxonole dyes, squarylium colorants, pyrylium salts, thiopyrylium dyes and nickel-thiolate complexes.

13. The negative planographic printing plate precursor of claim 1, wherein the polymerizable unsaturated group-having compound (B) comprises a compound selected from compounds that have at least one terminal ethylenically unsaturated bond.

14. The negative planographic printing plate precursor of claim 1, the plate precursor further comprising (D) a binder.

15. The negative planographic printing plate precursor of claim 14, wherein the binder (D) comprises a water-insoluble, alkaline aqueous solution-soluble linear organic polymer.

16. The negative planographic printing plate precursor of claim 14, wherein the binder (D) comprises at least one polymer selected from the group consisting of copolymers of benzyl (meth)acrylate and (meth)acrylic acid, copolymers of benzyl (meth)acrylate, (meth)acrylic acid and another addition-polymerizable vinyl monomer, copolymers of allyl (meth)acrylate and (meth)acrylic acid, and copolymers of allyl (meth)acrylate, (meth)acrylic acid and another addition-polymerizable vinyl monomer.

17. The negative planographic printing plate precursor of claim 14, wherein the binder (D) comprises at least one polymer selected from the group consisting of acid group-having urethane binder polymers, amide group-having binders, polyvinylpyrrolidone, polyethylene oxide, alcohol-soluble nylons, and polyethers of 2,2-bis(4-hydroxyphenyl) propane and epichlorohydrin.

* * * * *